(12) United States Patent
Ishida et al.

(10) Patent No.: US 6,593,765 B1
(45) Date of Patent: Jul. 15, 2003

(54) TESTING APPARATUS AND TESTING METHOD FOR SEMICONDUCTOR INTEGRATED CIRCUIT

(75) Inventors: Masahiro Ishida, Tokyo (JP); Takahiro Yamaguchi, Tokyo (JP); Yoshihiro Hashimoto, Tokyo (JP)

(73) Assignee: Advantest, Corp., Tokyo (JP)

( * ) Notice: Subject to any disclaimer, the term of this patent is extended or adjusted under 35 U.S.C. 154(b) by 149 days.

(21) Appl. No.: 09/663,700

(22) Filed: Sep. 15, 2000

(30) Foreign Application Priority Data

Sep. 17, 1999 (JP) .......................................... 11-263472

(51) Int. Cl.[7] .............................................. G01R 31/26
(52) U.S. Cl. .................................. 324/765; 324/158.1
(58) Field of Search .............................. 324/765, 158.1, 324/769, 73.1; 438/17, 18, 19; 257/48; 714/724, 733, 25

(56) References Cited

U.S. PATENT DOCUMENTS

| 5,760,599 | A | * | 6/1998 | Ehiro ........................ 324/765 |
| 5,773,990 | A | | 6/1998 | Wilstrup et al. |
| 6,031,386 | A | * | 2/2000 | Cole, Jr. et al. ............ 324/765 |
| 6,414,511 | B1 | * | 7/2002 | Janssen et al. .............. 324/769 |

OTHER PUBLICATIONS

An approach for detecting bridging fault induced delay faults in static CMOS circuit using dynami power supply current monitoring; Alvennon Walder IEEE 27411.*

On chip transient current nonitor for testing o flow voltage CMOS IC, Vstopjakova IEEE.*
"Transient Power Supply Voltage Analysis for Detecting IC Defects" International Test Conference 1997.
"Defect Detection with Transient Current Testing and its Potential for Deep Sub–micron CMOS ICS" International Test Conference 1998.
"Transient Power Supply Current Testing of Digital CMOS Circuits" International Test Conference 1995.
"Digital Integrated Circuit Testing Using Transient Signal Analysis" International Test Conference 1996.
"An Experimental Study Comparing the Relative Effectiveness of Functional Scan, IDDq and Delay–Fault testing" Proceeding 15, IEEE.
"Experimental Analysis of Transient Current Testing Based on Charge Observation" Electronics Letters, vol. 35, No. 6, Mar. 18, 1999.

* cited by examiner

Primary Examiner—Kamand Cuneo
Assistant Examiner—Jimmy Nguyen
(74) Attorney, Agent, or Firm—Muramatsu & Associates

(57) ABSTRACT

A testing apparatus is able to test a semiconductor integrated circuit with high observability. The testing apparatus includes a test pattern inputting means 14 for inputting a test pattern for activating a path under test of a semiconductor integrated circuit 20 to the semiconductor integrated circuit, a transient power supply current measuring means 16 for measuring transient power supply current supplied to the semiconductor integrated circuit while the path under test is being activated, and a fault detecting means 34 for judging absence and presence of a fault of the path under test, based on transient power supply current measured by the transient power supply current measuring means.

16 Claims, 34 Drawing Sheets

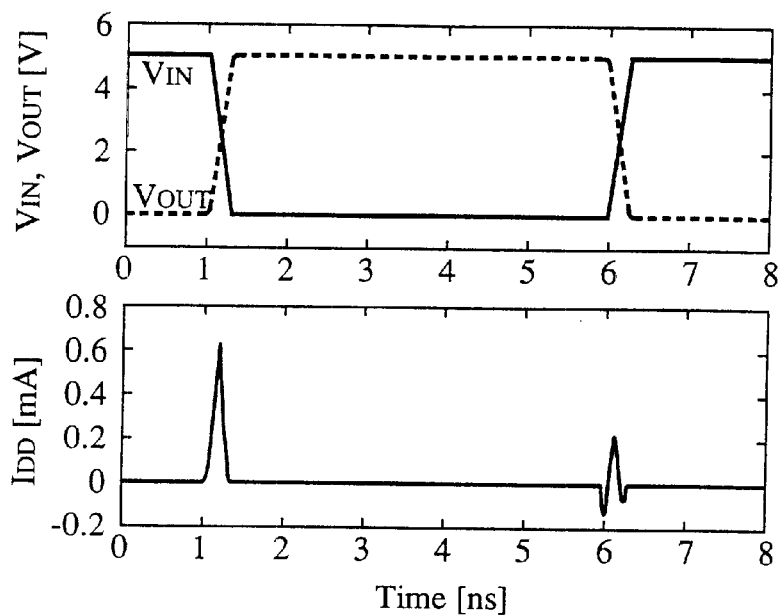
FIG. 1A
FIG. 1B
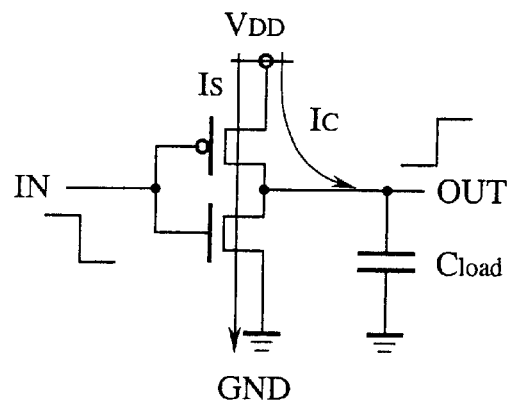
FIG. 1C
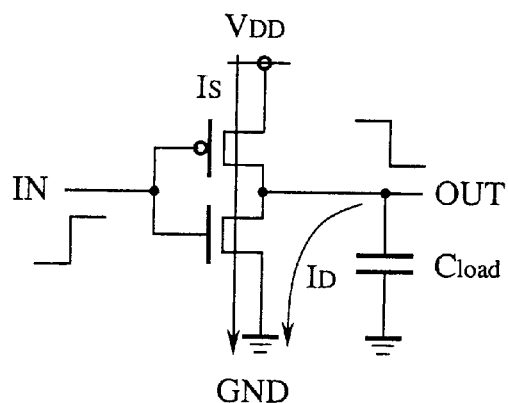
FIG. 1D

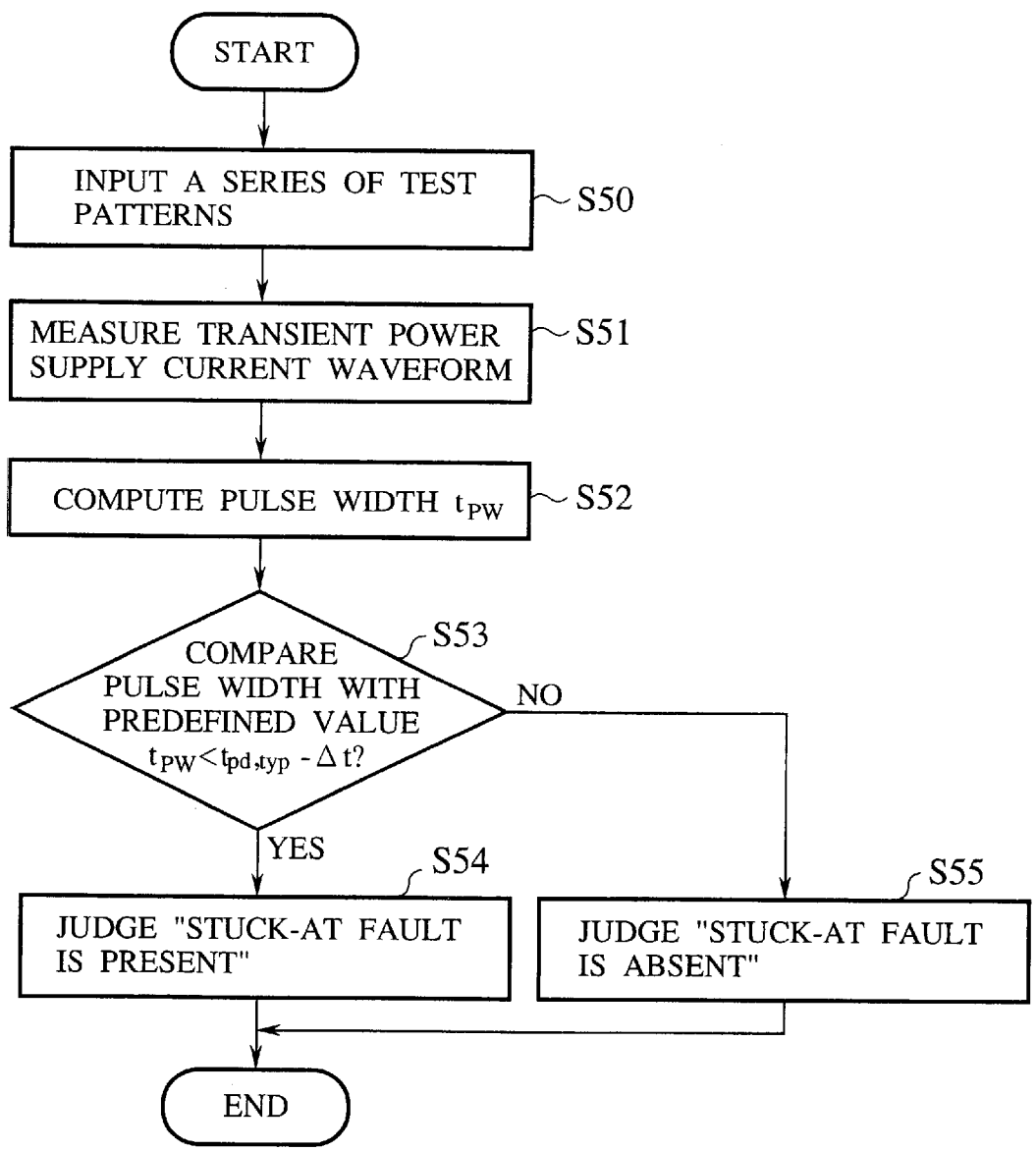

TESTING APPARATUS AND TESTING METHOD FOR SEMICONDUCTOR INTEGRATED CIRCUIT

BACKGROUND OF THE INVENTION

The present invention relates to a testing apparatus and testing method for semiconductor integrated circuits, more specifically a testing apparatus and testing method for semiconductor integrated circuits which have high observability and can readily detect presence and absence of delay faults and stuck-at faults.

Today, semiconductor integrated circuit devices using CMOS logic circuits are widely used. Such semiconductor integrated circuit devices are required to have prescribed performances, and are tested after fabricated as to whether or not they have satisfied the prescribed performances.

In a semiconductor integrated circuit, a path through which signals are propagated is called a path and a delay time from an input signal line, which is a start of the path to an output signal line, which is a terminal of the path is called a path delay time.

Recently, as operational speeds of semiconductor integrated circuits are increased, it is increasingly necessary to measure the path delay time of the semiconductor integrated circuits.

In a conventional path delay fault testing method, in order to detect a delay fault, based on an increase of a path delay time of a path under test, the logic gates of the path under test are activated to propagate a signal transition generated in an input signal line of the path under test to an output signal line of the path under test. Here, "activation" is to switch on all the logic gates of a path under test.

When a delay time of a path under test is longer than a prescribed time, it is judged that the path under test has a path delay fault, and when the delay time of the path under test is shorter than the prescribed time, it is judged that the path under test has no path delay fault.

However, in such a conventional path delay fault testing method, a signal transition generated in an input signal line of a path under test must be propagated to an output signal line of the path under test, and a path under test which can_@not propagate a signal transition to the output signal line cannot be tested. That is, the conventional path delay fault testing method has low observability.

In the conventional path delay fault testing method, to activate a path under test, non-control input values must be inputted to all side inputs which are not on the path under test. It is difficult to satisfy such requirement. Here, a side input is an input line which is not on a path under test. A non-control input value is a logic value which does not uniquely determine an output of each logic gate. For example, non-control input values of an AND gate and a NAND gate are logic value "1", and non-control input values of an OR gate and a NOR gate are logic value "0".

In the conventional path delay fault testing method, the above-described restriction is applied to input values to be inputted to side inputs. Accordingly, it is difficult to generate two test patterns which activate a path under test, i.e., a series of test patterns (a test vector pair).

In the conventional path delay fault testing method, it is necessary that hazards (beard-like pulses) are not generated in side inputs so that hazards (beard-like pulses) are not outputted to an output signal line. It is difficult to set side inputs so as to satisfy such condition.

On the other hand, quiescent power supply current testing method ($I_{DDQ}$ testing method) is proposed as a testing method which has high observability and can easily generate test patterns. The $I_{DDQ}$ testing method does not measure a power supply current in a transient state of a semiconductor integrated circuit, but measures a power supply current in a stable state of the semiconductor integrated circuit. Accordingly, the $I_{DDQ}$ testing method cannot measure a path delay time. In other words, the $I_{DDQ}$ testing method mainly tests absence and presence of a bridge defect of a semiconductor integrated circuit, and cannot detect an open defect and a parametric defect which are primary factors of a delay fault, i.e., abnormalities of process parameters in the fabrication process.

As a method substituting the $I_{DDQ}$ testing method, a testing method ($I_{DDT}$ testing method) which measures a transient current value of a power supply current, i.e., an instantaneous value of a transient power supply current has been proposed. The $I_{DDT}$ testing method is described in, e.g., M. Sachdev, P. Janssen and V. Zieren, "Defect Detection with Transient Current Testing and its Potential for Deep Sub-micron ICs", Proceedings of IEEE International Test Conference, pp. 204–213, 1998. Sachdev et al. evaluate the $I_{DDT}$ testing method as a method substituting the $I_{DDQ}$ testing method, and describe that the $I_{DDT}$ testing method is applicable to fabrication tests for deep sub-micron VLSIs. They describe based on results of the experiment that the $I_{DDT}$ testing method can detect faults of devices having high levels of background current. They do not refer to a testing method for path delay Recently, as semiconductor integrated circuits are more integrated, paths under test are on increase. Furthermore, circuit modules of semiconductor integrated circuits are buried at deep layer-levels, which makes it additionally difficult to measure a delay time of the path under test. In order to solve such problems, it has been proposed to design a semiconductor integrated circuit such that a part or all of flip-flops of the semiconductor integrated circuit can be scanned, and contents of the flip-flops can be sequentially read out by external control. In this case, a number of clocks are required to read out the contents of the flip-flops. A test time is accordingly long.

Recently, as semiconductor integrated circuits are more integrated, paths under test for path delay time are on increase. It takes long time to measure the path delay time. Accordingly, increase of the test cost is a recent problem.

Accordingly, a testing method which, for saving test costs, can measure efficiently path delay time of semiconductor integrated circuits, has high observability of path delay time and can easily generate test patterns has been expected.

Furthermore, micro-open defects and resistive open defects are problems. A micro-open defect is a very small line breaking defect taking place in a signal line. A very small amount of tunnel current flows through the micro-open defect. A resistive open defect is a defect in which contact resistance between signal lines becomes higher due to a defective contact than a normal value, and a resistance value of the signal lines becomes higher due to breakage of the signal lines. Current flowing through a resistive open defect becomes smaller than a normal value. When a micro-open defect or a resistive open defect is present in a signal line or others, a transition time of a signal is increased, and accordingly a path delay time becomes longer. A micro-open defect and resistive open defect often increase current flowing through a circuit, and accordingly increase power consumption. Thus, the micro-open defect and resistive open defect are detrimental to realizing semiconductor integrated circuit devices of high speed and low electric power consumption. However, the conventional testing methods cannot efficiently detect the micro-open defect and resistive open defect.

SUMMARY OF THE INVENTION

An object of the present invention is to provide a testing apparatus and testing method for semiconductor integrated circuits, which have high observability and can readily detect delay faults, stuck-at faults, etc.

The above-described object is achieved by a testing apparatus for a semiconductor integrated circuit comprising: test pattern inputting means for inputting to the semiconductor integrated circuit a test pattern sequence for activating a path under test of the semiconductor integrated circuit; transient power supply current measuring means for measuring transient power supply current supplied to the semiconductor integrated circuit while the path under test is being activated; and fault detecting means for judging absence and presence of a fault in the path under test, based on the transient power supply current measured by the transient power supply current measuring means. Absence and presence of a delay fault and a stuck-at fault can be easily detected with high observability.

In the above-described testing apparatus for a semiconductor integrated circuit, it is preferable that the transient power supply current measuring means measures a width of a waveform of the transient power supply current; and the fault detecting means judges presence of a delay fault in the path under test when the width of the waveform of the transient power supply current is larger than a standard width of a waveform of transient power supply current, which is an expected value of the path under test, by a prescribed value.

In the above-described testing apparatus for a semiconductor integrated circuit, it is preferable that the transient power supply current measuring means measures a width of a waveform of the transient power supply current; and the fault detecting means judges that a stuck-at fault is present in the path under test when the width of the waveform of the transient power supply current is smaller than a standard width of a waveform of transient power supply current, which is an expected value of the path under test, by a prescribed value.

In the above-described testing apparatus for a semiconductor integrated circuit, it is preferable that the transient power supply current measuring means includes a capacitor for supplying power supply current to the semiconductor integrated circuit, and measures a time differential value of a voltage applied to the semiconductor integrated circuit by the capacitor to thereby give a waveform of the transient power supply current.

In the above-described testing apparatus for a semiconductor integrated circuit, it is preferable that the transient power supply current measuring means measures an instantaneous value of the transient power supply current at a timing which is later than a standard delay time, which is an expected delay time of the path under test, by a prescribed time; and the fault detecting means judges that a delay fault is present in the path under test when an instantaneous value of the transient power supply current at the timing is larger than a threshold value which allows judgement that the transient power supply current is being supplied to the semiconductor integrated circuit.

In the above-described testing apparatus for a semiconductor integrated circuit, it is preferable that the transient power supply current measuring means measures a value of the transient power supply current at a timing which is earlier than a normal delay time, which is an expected delay time of the path under test, by a prescribed time; and the fault detecting means judges that a stuck-at fault is present in the path under test when a value of the transient power supply current at the timing is smaller than a threshold value which allows judgement that the transient power supply current is being supplied to the semiconductor integrated circuit.

In the above-described testing apparatus for a semiconductor integrated circuit, it is preferable that the transient power supply current measuring means includes a capacitor for supplying power supply current to the semiconductor integrated circuit, and measures a time differential value of a voltage applied to the semiconductor integrated circuit by the capacitor to thereby give an instantaneous value of the transient power supply current.

In the above-described testing apparatus for a semiconductor integrated circuit, it is preferable that the transient power supply current measuring means measures an integral value of the transient power supply current; and the fault detecting means judges that a delay fault is present in the path under test when the integral value of the transient power supply current is larger than an integral value corresponding to a standard delay time, which is an expected delay time of the path under test, by a prescribed value.

In the above-described testing apparatus for a semiconductor integrated circuit, it is preferable that the transient power supply current measuring means measures an integral value of the transient power supply current; and the fault detecting means judges that a stuck-at fault is present in the path under test when the integral value of the transient power supply current is smaller than an integrated value corresponding to a standard delay time, which is an expected delay time of the path under test, by a prescribed value.

In the above-described testing apparatus for a semiconductor integrated circuit, it is preferable that the transient power supply current measuring means measures an integral value of the transient power supply current; and the fault detecting means judges that a micro-open defect or resistive open defect is present in the path under test when the integral value of the transient power supply current is larger than an integral value corresponding to a standard delay time, which is an expected delay time of the path under test, by a prescribed value.

The above-described object is achieved by a testing method for a semiconductor integrated circuit comprising: inputting a test pattern sequence for activating a path under test of a semiconductor integrated circuit, and judging absence and presence of a fault in the path under test, based on transient power supply current supplied to the semiconductor integrated circuit while the path under test is being activated.

In the above-described testing method for a semiconductor integrated circuit, it is preferable that absence and presence of a delay fault or a stuck-at fault in the path under test is judged by comparing a width of a waveform of the transient power supply current with a standard width of a waveform of transient power supply current, which is an expected value of the path under test.

In the above-described testing method for a semiconductor integrated circuit, it is preferable that absence and presence of a delay fault or a stuck-at fault in the path under test is judged by comparing an instantaneous value of the transient power supply current at a timing which is later or earlier by a prescribed time than a standard delay time which is an expected delay time of the path under test, with a threshold value which allows judgement that transient power supply current is being supplied to the semiconductor integrated circuit.

In the above-described testing method for a semiconductor integrated circuit, it is preferable that absence or presence of a delay fault, a stuck-at fault, a micro-open defect or a resistive open defect in the path under test is judged by comparing an integral value of the transient power supply current with an integral value corresponding to a standard delay time which is an expected delay time of the path under test.

The above-described object is achieved by a delay time measuring apparatus comprising: test pattern inputting means for inputting a test pattern sequence for activating a path under test of a semiconductor integrated circuit to the semiconductor integrated circuit; transient power supply current waveform measuring means for measuring a width of a waveform of transient power supply current supplied to the semiconductor integrated circuit while the path under test is being activated; and delay time measuring means for measuring a delay time of the path under test, based on the width of the waveform of the transient power supply current measured by the transient power supply current waveform measuring means. A path delay time of a path under test can be measured easily with high observability.

The above-described object is achieved by a method for measuring a delay time comprising: inputting a test pattern sequence for activating a path under test of a semiconductor integrated circuit to the semiconductor integrated circuit; and measuring a delay time of the path under test, based on a width of a waveform of transient power supply current supplied to the semiconductor integrated circuit while the path under test is being activated. A path delay time of a path under test can be measured easily with high observability.

As described above, according to the present invention, a path delay time of a path under test can be measured easily by giving a pulse width of a transient power supply current waveform. Furthermore, according to the present invention, a waveform of transient power supply current, which is easy to measure, is measured, which more facilitates the path delay time measurement than the path delay time measurement using voltage signals.

According to the present invention, a waveform of transient power supply current is measured, whereby a path under test which cannot output outside an output signal can be tested. In addition, according to the present invention, the test can be made by inputting an arbitrarily generated series of test patterns, whereby the testing method can be simply made. According to the present invention, there is no special restriction to input values of side inputs, whereby the test can be simply made.

According to the present invention, absence and presence of a delay fault of a path under test can be detected by giving a pulse width of a waveform of transient power supply current, comparing the pulse width with an upper limit value of an allowable delay time. Furthermore, according to the present invention, when a test pattern which can activate a plurality of paths is available, delay faults of the plural paths can be simultaneously detected.

According to the present invention, absence and presence of a stuck-at fault of a path under test can be detected by giving a pulse width of a waveform of transient power supply current, and comparing the pulse width to a value taking into account variations of a fabrication process.

According to the present invention, an instantaneous value of transient power supply current of a prescribed timing is used to evaluate a delay fault and stuck-at fault, whereby absence and presence of a fault of a path under test of a semiconductor integrated circuit can be easily judged.

According to the present invention, absence and presence of a delay fault and stuck-at fault of a path under test of a semiconductor integrated circuit can be easily detected by using an integral value of transient power supply current to thereby detect a delay fault.

BRIEF DESCRIPTION OF THE DRAWINGS

FIGS. 1A to 1D are views of transient responses of a CMOS inverter.

FIG. 14 is a flow chart of the stuck-at fault testing method according to the first embodiment of the present invention.

DETAILED DESCRIPTION OF THE INVENTION

First Embodiment

Before the delay time measuring method, etc. according to a first embodiment of the present invention are explained, a basic principle on which the present embodiment is based on will be explained.

Transient responses of a CMOS inverter, which is widely used in semiconductor integrated circuits, will be explained with reference to FIG. 1. FIG. 1 is a view of transient responses of the CMOS inverter. In FIG. 1A, the solid line indicates input voltages $V_{IN}$, and the broken line indicates output voltages $V_{OUT}$. FIG. 1B shows transient current $I_{DD}$ flowing to the inverter. FIG. 1C shows currents at respective parts at the time when a falling transition takes place at the input of the inverter. FIG. 1D shows currents at respective parts at the time when a rising transition takes place at the input of the inverter.

As shown in FIG. 1A, when an input to the inverter transits from "1" to "0", an output of the inverter transits from "0" to "1". At an instant when an input voltage $V_{IN}$ is higher than a threshold voltage of the n-MOS transistor and lower than a threshold voltage of the p-MOS transistor, both the n-MOS transistor and the p-MOS transistor are instantaneously turned on at the same time. Accordingly, as shown in FIG. 1C, short-circuit current $I_S$ flows from a power supply $V_{DD}$ to the ground.

Concurrently therewith, an output of the inverter transits form "0" to "1", and as shown in FIG. 1C, charge current $I_C$ flows from the power supply $V_{DD}$ to a parasitic capacitance $C_{load}$ of the output signal line of the inverter.

Thus, when a falling transition takes place at the input of the CMOS inverter, transient current $I^{DD}$ flowing into the inverter is a sum of the short-circuit current $I_S$ and the charge current $I_C$. In this case, as shown in FIG. 1B, large transient current $I_{DD}$ flows.

On the other hand, when an input of the inverter transits from "0" to "1", and an output of the inverter transits from "1" to "0", as shown in FIG. 1D, discharge current $I_D$ flows from the parasitic capacitor $C_{load}$ of the output signal line of the inverter to the ground. However, current flowing from the power supply $V_{DD}$ to the inverter is the short-circuit current $I_S$ alone.

In this case, the transient current $I_{DD}$ flowing to the inverter is the short-circuit current $I_S$ alone, and as shown in FIG. 1B, small transient current $I_{DD}$ flows.

Figure 2A:
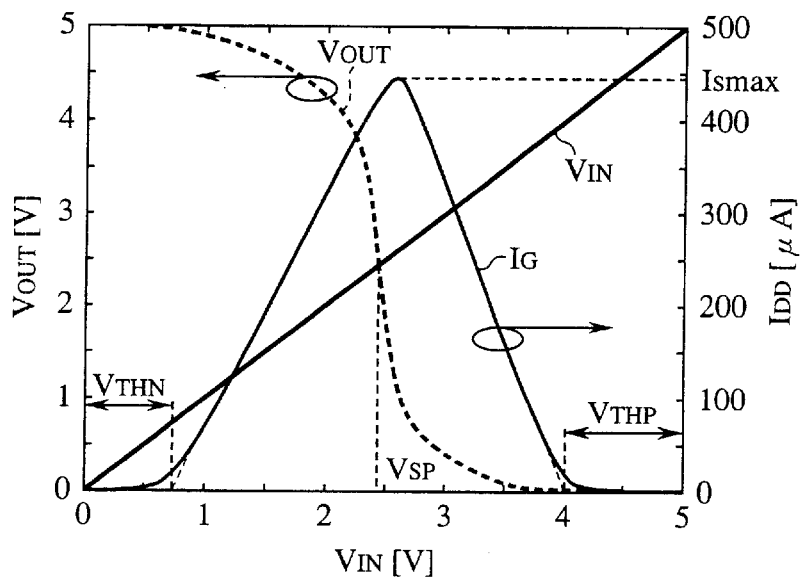
FIGS. 2A and 2B are enlarged views of transient response waveforms of the CMOS inverter.
Figure 2B:
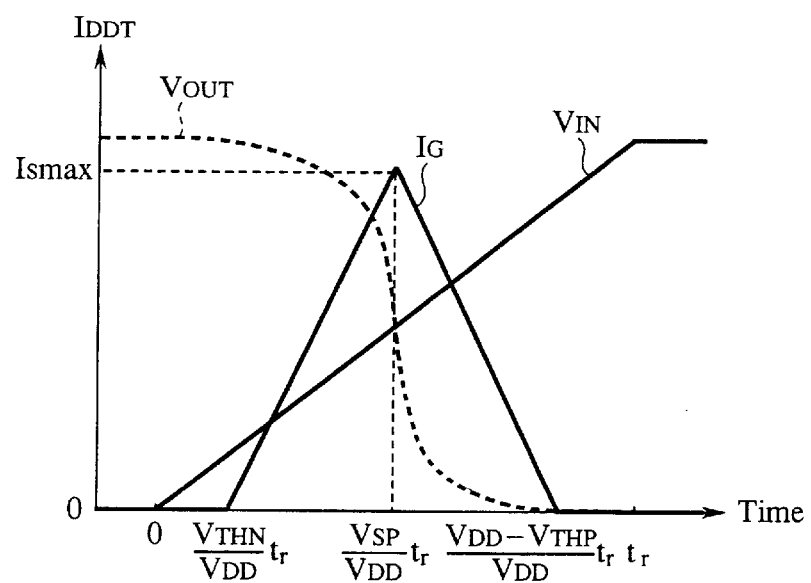

Then, transient response characteristics of the CMOS inverter will be explained with reference to FIGS. 2A and 2B. FIGS. 2A and 2B are enlarged views of a transient response waveform of the CMOS inverter. FIG. 2A shows transfer characteristics of the inverter and a current response waveform thereof. FIG. 2B shows an approximated transient current response waveform.

As shown in FIG. 2A, current $I_G$ of the CMOS inverter changes to a triangular pulse shape as the input voltage $V_{IN}$ rises. When the parasitic capacitance $C_{load}$ of the output signal line of the inverter is small, most of the transient current $I_G$ flowing into the inverter is the short-circuit current $I_S$. When it is assumed that the input voltage $V_{IN}$ transits in a ramp-shape, a waveform of the transient current $I_G$ can be approximated by the triangular pulse shown in FIG. 2B.

A waveform of the transient current $I_G$ shown in FIG. 2B, which is approximated by the triangular pulse, can be approximated by $$I_G = x(t) = \begin{cases} 0, & t \leq \frac{V_{THN}}{V_{DD}}t_r \\ \frac{V_{DD} \cdot I_{Smax}}{(V_{SP} - V_{THN}) \cdot t_r}t - \frac{V_{THN} \cdot I_{Smax}}{(V_{SP} - V_{THN})}, & \frac{V_{THN}}{V_{DD}}t_r < t \leq \frac{V_{SP}}{V_{DD}}t_r \\ \frac{V_{DD} \cdot I_{Smax}}{(V_{SP} - V_{DD} + V_{THP}) \cdot t_r}t - \frac{(V_{DD} - V_{THP}) \cdot I_{Smax}}{(V_{SP} - V_{DD} + V_{THP})}, & \frac{V_{SP}}{V_{DD}}t_r < t \leq \frac{V_{DD} - V_{THP}}{V_{DD}}t_r \\ 0, & t > \frac{V_{THP}}{V_{DD}}t_r \end{cases} \quad (1)$$

In Formula 1, $I_{Smax}$ represents a maximum value of the transient current $I_G$ flowing into the inverter, $V_{DD}$ represents the power supply voltage, $V_{THN}$ represents a threshold voltage of the n-MOS transistor, $V_{THP}$ represents a threshold voltage of the p-MOS transistor, and $t_r$ represents a rising transition time of an input signal.

But, the threshold voltage $V_{THP}$ has an absolute value. To simplify the approximation formula, a timing of the start of transition of the input voltage $V_{IN}$ is 0.

Formula 1 is an approximation formula for the CMOS inverter, but the approximation can be performed for logic gates other than the CMOS inverter by the same formula. The same approximation formula is applicable to a case that a falling transition takes place at the input voltage $V_{IN}$.

As seen in FIG. 2B, the transient current $I_G$ flowing into the logic gate monotonously increases until the transient current $I_G$ reaches a maximum value $I_{Smax}$, and monotonously decreases after the transient current $I_G$ has reached the maximum value $I_{Smax}$. The transient current arrives at the maximum value $I_{Smax}$ when the input voltage $V_{IN}$ reaches switching voltage $V_{SP}$ of the logic gate. That is, a timing when the transient current $I_G$ reaches a maximum value agrees with that of input transition of the logic gate.

On the other hand, the logic gate has a delay time, and a timing of an output transition of the logic gate is a little behind a timing of an input transition of the logic gate. That is, a timing when the transient current $I_G$ arrives at a peak is a little earlier than a timing of an output transition of the logic gate. It may be considered that, in this case, a falling edge of a waveform of the transient current $I_G$ agrees with a timing of the output transition. A pulse width of a waveform of the transient current $I_G$ of the logic gate is proportional to a transition time of the input voltage $V_{IN}$, e.g., a rising transition time $t_r$.

The above-described transient characteristic is valid when the parasitic capacitance $C_{load}$ of the output signal line of the CMOS inverter is small.

However, recently, as semiconductor integrated circuits are more micronized, parasitic capacitance $C_{load}$ of the output signal lines tends to be larger than the conventional integrated circuits. Accordingly, in the transient current $I_G$ flowing from the electric power supply into the logic gates, the charge current $I_C$ flowing into the output signal lines of the inverters tends to be larger than the short-circuit current $I_S$.

When the charge current $I_C$ flowing into the output signal line of the inverter is sufficiently larger in comparison with the short-circuit current $I_S$, a timing when a waveform of the transient current $I_G$ reaches a peak, and a timing when the charge current $I_C$ reaches a peak substantially agree with each other. Because the charge current $I_C$ depends on voltage transition of the output signal line, a timing when the transient current $I_G$ arrives at a peak, and a timing when an output of the logic gate substantially agree with each other.

Figure 3A:
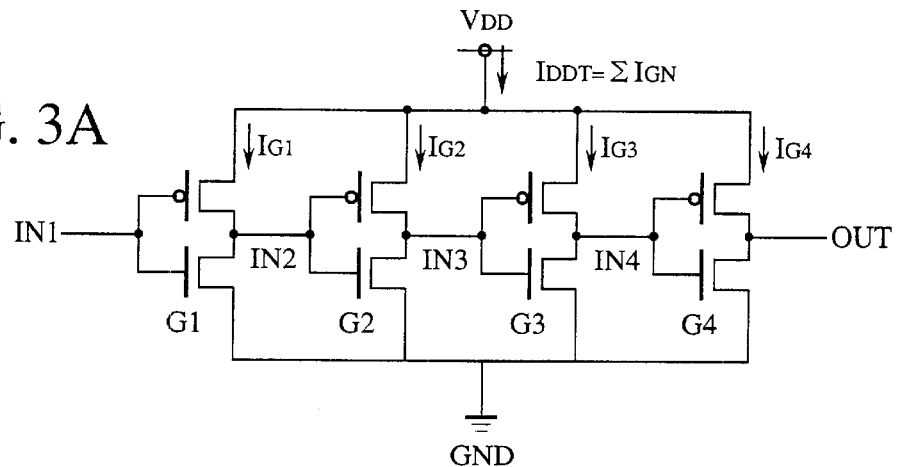
FIGS. 3A to 3C are views of a basic principle of a semiconductor integrated circuit including a plurality of logic gates.
Figure 3B:
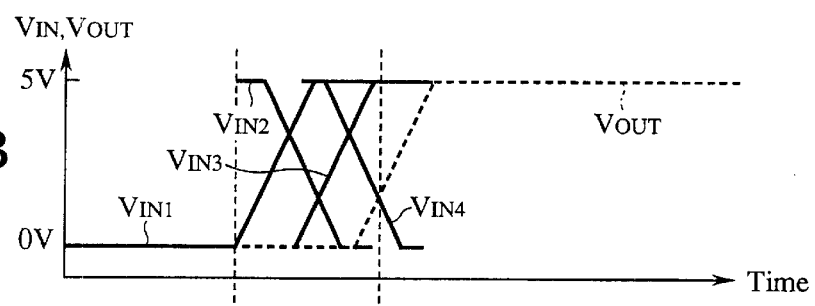
Figure 3C:
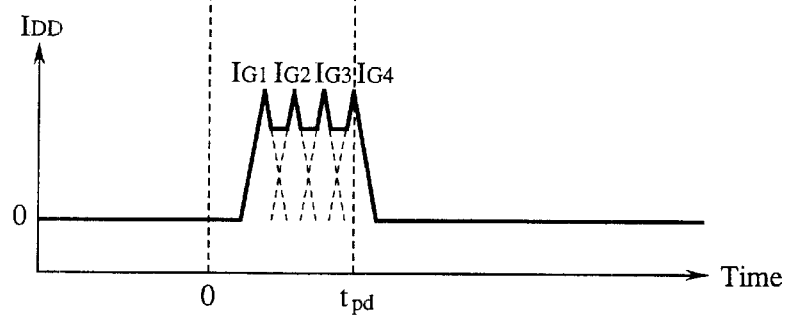

Next, transient characteristics in a case that a semiconductor integrated circuit includes a plurality of logic gates will be explained with reference to FIGS. 3A to 3C. FIGS. 3A to 3C are views of a basic principle of a semiconductor integrated circuit including a plurality of logic gates. FIG. 3A shows an integrated circuit including four serially connected CMOS inverters which are shown in FIGS. 1A to 1D. FIG. 3B is a time chart showing input/output voltage characteristics of the respective logic gates. FIG. 3C is a time chart of transient power supply current flowing into the power supply line of the semiconductor integrated circuit.

As shown in FIG. 3A, one electric power supply $V_{DD}$ supplies current to the CMOS inverters G1, G2, G3, G4. Accordingly, transient power supply current $I_{DD}$ flowing the power supply line of the semiconductor integrated circuit is a sum of current $I_{G1}$, $I_{G2}$, $I_{G3}$, $I_{G4}$ flowing through the respective CMOS inverters. Accordingly, the transient power supply current $I_{DD}$ has the waveform shown in FIG. 3C.

As shown in FIG. 3B and FIG. 3C, peaks or falling edges of transient current waveforms of the respective logic gates correspond to timings of transitions of outputs of the logic gates. Accordingly, a last peak or a last falling edge of a transient response waveform of the power supply current of the semiconductor integrated circuit agrees with a timing when an output of the logic gate $G_4$, which switches on last in the semiconductor integrated circuit.

Accordingly, a timing of a last peak or a last falling edge of a waveform of the transient power supply current is detected and compared with a timing of an input transition, whereby a delay time of a path under test can be given.

A timing of a last falling edge of a transient power supply current waveform may be a timing when, for example, the transient power supply current has a predefined current value. A predefined current value may be a value of the power supply current at which, for example, an output of the last logic gate on the path under test has a value which is half a value of the power supply voltage. A predefined current value may be given based on, e.g., circuit simulations, statistical data given by actual devices, or others.

A delay time of the path under test detected as above, and a predefined time are compared with each other, whereby it can be judged whether or not a path delay fault is present in the path under test. An example of the predefined time may be a period $T_{CLK}$ of a clock used in the semiconductor integrated circuit.

Then, the path delay fault will be defined.

The path delay fault will be defined by means of an example that two test patterns $T=<V_1, V_2>$ are inputted to the semiconductor integrated circuit, and a path $P=\{g_0, g_1, g_2, \ldots, g_m\}$ is activated, where $g$, represents an input signal line of the path P, and $g_1, g_2, \ldots, g_m$ represent output signal lines of logical gates $G_1, G_2, \ldots, G_m$ on the path P. The output signal lines are also input signal lines of logical gate of the next stage, where $g_0, g_1, \ldots, g_{m-1}$ are also input signal lines of the logical gates $G_1, G_2, \ldots, G_m$ on the path P.

When timings of signal transitions of the respective signal lines $g_0, g_1, \ldots, g_m$, e.g., timings when signal voltages become half a power supply voltage $V_{DD}$ are represented respectively by $\tau_0, \tau_1, \ldots, \tau_m$ gate delay times $t_{gdi}$ of the respective logic gates $G_1, G_2, \ldots, G_m$ on the path P are respectively expressed by $$t_{gdi} = \tau_i - \tau_{i-1} \tag{2}$$

wherein $1 \le i \le m$.

A path delay time $t_{pd}$ of the path P is a sum of gate delay times $t_{gdi}$. Accordingly, a path delay time $t_{pd}$ of the path P is expressed by $$t_{pd} = \sum_{i=1}^{m} t_{gdi} = \tau_m - \tau_0 \tag{3}$$

In an actual semiconductor integrated circuit, however, delay times of the logic gates vary due to defects, etc. of the signal lines. Accordingly, when a typical value of the gate delay time of the logic gate $G_i$ is represented by $t_{gdi,typ}$, a variable component of the gate delay time is represented by $\delta_i$, an actual gate delay time $t_{gdi}$ is expressed by $$t_{gdi} = t_{gdi,typ} + \delta_i, \; 1 \le i \le m \tag{4}$$

When a micro-open defect or a resistive open defect is present in the path P, a delay time of a logic gate having the defect is increased, but delay times of the logic gates having no defect do not increase. On the other hand, a parametric defect increases delay times of all the logic gates.

Then, a path delay time $t_{pd}$ varies in accordance with a variation of the gate delay times. When a typical value of the path delay time of the path P is represented by $t_{pd,typ}$, and a variable component of the path delay time is represented by $\Delta$, a path delay time $t_{pd}$ is expressed by $$t_{pd} = t_{pd,typ} + \Delta = \sum_{i=1}^{m}(t_{gdi,typ} + \delta_i) \quad (5)$$

Figure 4A:
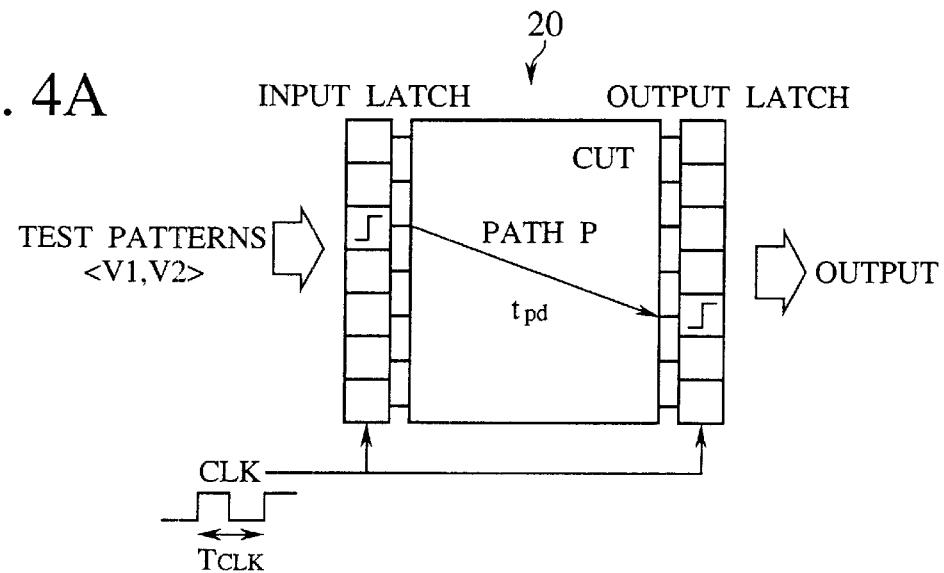
FIGS. 4A to 4C are conceptual views of a basic principle of the conventional fault testing method.
Figure 4B:
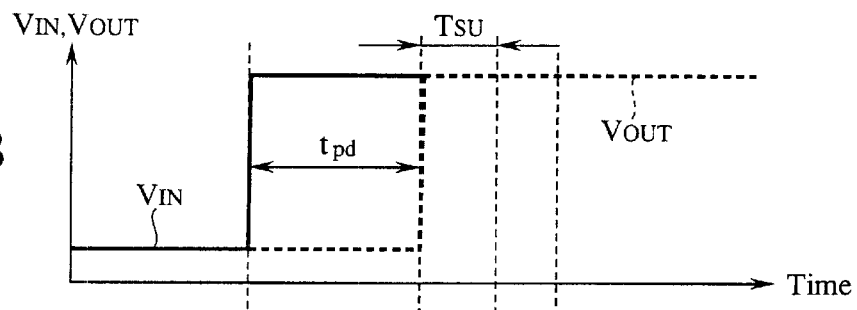
Figure 4C:
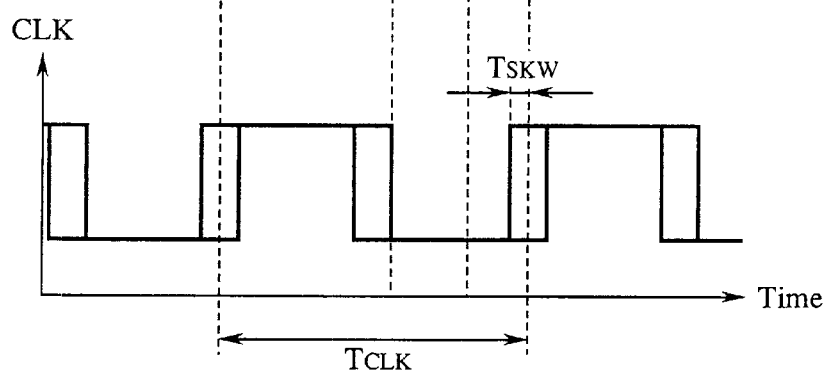

Then, a basic principle of the conventional delay fault testing method will be explained with reference to FIGS. 4A to 4C. FIGS. 4A to 4C are conceptual views showing the basic principle of the delay fault testing method.

As shown in FIG. 4A, test patterns T=<$V_1$, $V_2$> are inputted to a circuit under test (CUT) 20.

In order to normally operate the circuit under test shown in FIG. 4A, a time from the input of the test pattern to an input latch to the output of an output signal to an output latch must be within a predefined path delay time.

Accordingly, a path delay time $t_{pd}$ of a path P must satisfy the condition.

$$t_{pd} + T_{SU} < T_{CLK} - T_{SKW} \quad (6)$$

where a setup time of a signal is $T_{SU}$, a period of a device clock is represented by $T_{CLK}$, and a clock skew of the device clock is represented by $T_{SKW}$.

When Formula 6 is transformed, $$t_{pd} < T_{CLK} - T_{SKW} - T_{SU} = T' \quad (7)$$

is given.

That is, a path delay time $t_{pd}$ of the path P must be shorter than a time T' given by subtracting a setup time $T_{SU}$ and a clock skew $T_{SKW}$, etc. from a clock period $T_{CLK}$.

When a path delay time $t_{pd}$ is longer than the time T', signal propagation is not in time for a clock $T_{CLK}$, and the circuit is locked in a certain state. A fault which makes a path delay time so long that the circuit cannot normally operate is defined to be a delay fault in this specification.

That is, when a path delay time $t_{pd}$ is longer than a predefined time T', a path delay fault is present in the path P. In this case, T' means an upper limit value of an allowable path delay time.

Figure 5A:
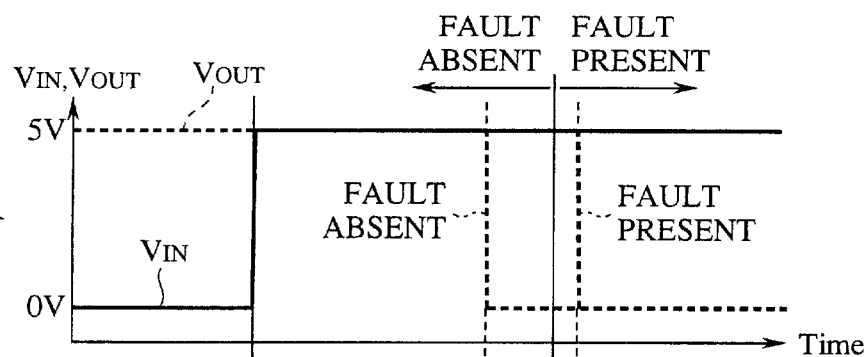
FIGS. 5A and 5B are time charts showing a basic principle of the testing method for semiconductor integrated circuits according to the first embodiment of the present invention.
Figure 5B:
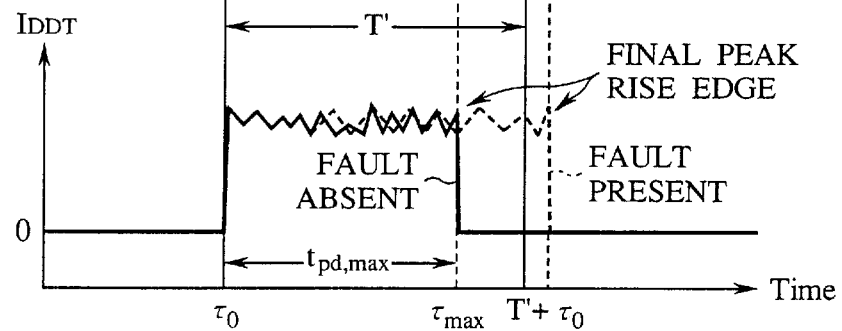

Then, a basic principle of the testing method for semiconductor integrated circuits according to the present embodiment will be explained with reference to FIGS. 5A and 5B. FIGS. 5A and 5B are time charts showing the basic principle of the testing method for semiconductor integrated circuits according to the present embodiment.

The testing method for semiconductor integrated circuits according to the present embodiment is characterized mainly in that a pulse width of a transient power supply current waveform of a circuit under test is measured to thereby test the circuit for absence or presence of a delay fault.

Here is considered a case, for example, that two test patterns T=<$V_1$, $V_2$> are inputted to a circuit under test shown in FIGS. 4A to 4C, and a plurality of paths $P_1, P_2, \ldots, P_n$ are activated. In this case, a timing when the j-th logic gate from the input on the path $P_i$ is switched is $\tau_{ij}$, a timing $\tau_{max}$ of an output transition of a logic gate $G_{final}$ which last switches on paths $P_1, P_2, \ldots, P_n$ is expressed $$\tau_{max} = \max_{i,j}\{\tau_{ij}\}, \quad 1 \leq i \leq n, \quad 1 \leq j \quad (8)$$

A maximum value $t_{pd,max}$ of the path delay time of the paths $P_1, P_2, \ldots, P_n$ is a time interval between a timing $\tau_{max}$ of an output transition and a timing $\tau_0$ of an input transition.

Accordingly, a maximum value $t_{pd,max}$ of the path delay time is expressed by $$t_{pd,max} = \tau_{max} - \tau_0 \quad (9)$$

On the other hand, a pulse width $t_{PW}$ of a waveform of transient power supply current of the logic circuit is a time interval between a timing $\tau_0$ of an input transition of the circuit, and a timing $\tau_{IDD}$ of a final peak or a falling edge of a waveform of the transient power supply current.

Accordingly, a pulse width $t_{PW}$ of a waveform of transient power supply current is expressed by $$t_{PW} = \tau_{IDD} - \tau_0 \quad (10)$$

As described above, a timing $\tau_{IDD}$ of a final peak or a falling edge of a waveform of transient power supply current agrees with or earlier than a timing $\tau_{max}$ of an output transition of the logic gate $G_{final}$ which last switches.

Accordingly, a pulse width $t_{PW}$ of a waveform of transient power supply current corresponds to a delay time $t_{pd,max}$ of the path P activated by the test pattern T, and is expressed by $$t_{PW} = \tau_{IDD} - \tau_0 \leq \tau_{max} - \tau_0 = t_{pd,max} \quad (11)$$

When a pulse width $t_{PW}$ of a waveform of transient power supply current is larger than an upper limit value T' of an allowable delay time, $$T' < t_{PW} \leq t_{pd,max} \quad (12)$$

can be given.

In this case, in the path having a maximum delay time $t_{pd,max}$, a signal propagation time is not in time for a clock used in the semiconductor integrated circuit. Accordingly, in this case, a delay fault is present in the semiconductor integrated circuit.

When a pulse width $t_{PW}$ is thus larger than an upper limit value T' of an allowable delay time, a path delay fault is present in one of activated paths. When a pulse width $t_{PW}$ is smaller than an upper limit value T', no path delay fault is present in any of activated paths.

Then, $$\begin{cases} \text{Delay fault is absent,} & t_{PW} \leq T' \\ \text{Delay fault is present,} & t_{PW} > T' \end{cases} \quad (13)$$

is given.

As described above, according to the present embodiment, a pulse width $t_{PW}$ of a waveform of transient power supply current is given and compared with an upper limit value T' of an allowable delay time, whereby the test is made for detecting the absence or presence of a delay fault of a path under test. Furthermore, according to the present embodiment, a waveform of transient power supply current is measured, which is easier than the measurement made on the voltage signals. When a test pattern which can activate simultaneously a plurality of paths is available, it is possible to simultaneously test delay faults of the plurality of paths.

Furthermore, according to the present invention, a waveform of transient power supply current is measured, whereby even a path under test which cannot output signals to the outside can be tested. According to the present embodiment, an arbitrarily generated series of patterns is inputted for the test, whereby the testing method can be simplified. According to the present embodiment, input values of side inputs are not specially restricted, whereby the test can be readily made.

The testing method for semiconductor integrated circuits according to the present embodiment can test absence and presence of not only delay faults but also stuck-at faults. Here, the stuck-at fault is a fault in which a logic value of a signal line is fixed to a certain value.

A basic principle of the testing method for detecting a stuck-at fault according to the present embodiment will be explained below.

A delay time $t_{pd}$ of a path under test varies depending on process parameters of a fabrication process for a semiconductor integrated circuit. A pulse width $t_{pw}$ of a waveform of transient power supply current accordingly varies. In a case that a variation range of a delay time $t_{pd}$ of a path under test is, e.g., ±10% of a typical value $t_{pd,typ}$, a pulse width $t_{PW}$ of a waveform of transient power supply current also varies in a range of ±10% of a typical value $t_{pd,typ}$. When a pulse width $t_{PW}$ of a waveform of transient power supply current is decreased largely beyond this range, it can be considered that a stuck-at fault is present.

For example, in a case that a pulse width $t_{PW}$ decreases by above 20% to a typical value $t_{pd,typ}$, there is a possibility that a stuck-at fault is present in a path under test.

Accordingly, when a pulse width $t_{PW}$ of a waveform of transient power supply current is smaller than a predefined value, it can be judged that a stuck-at fault is present. In this case, a predefined value can be a lower limit value $t_{pd,typ}-\Delta_t$ of a delay time which can be generated by variation of process parameters. Here, $\Delta_t$ represents a variation.

Then, $$\begin{cases} \text{Stuck-at fault is absent}, & t_{PW} \geq t_{pd,typ} - \Delta_t \\ \text{Stuck-at fault is present}, & t_{PW} < t_{pd,typ} - \Delta_t \end{cases} \quad (14)$$

can be given.

In Formula 14, a typical value $t_{pd,typ}$ and a variation $\Delta_t$ can be given by simulation of process variations, statistic data given by using actual devices or others.

As described above, according to the present embodiment, a pulse width of a waveform of transient power supply current, and a value taking into consideration of variations of a fabrication process are compared with each other so as to make the testing for a stuck-at fault.

(Delay Time Measuring Apparatus)

Figure 6:
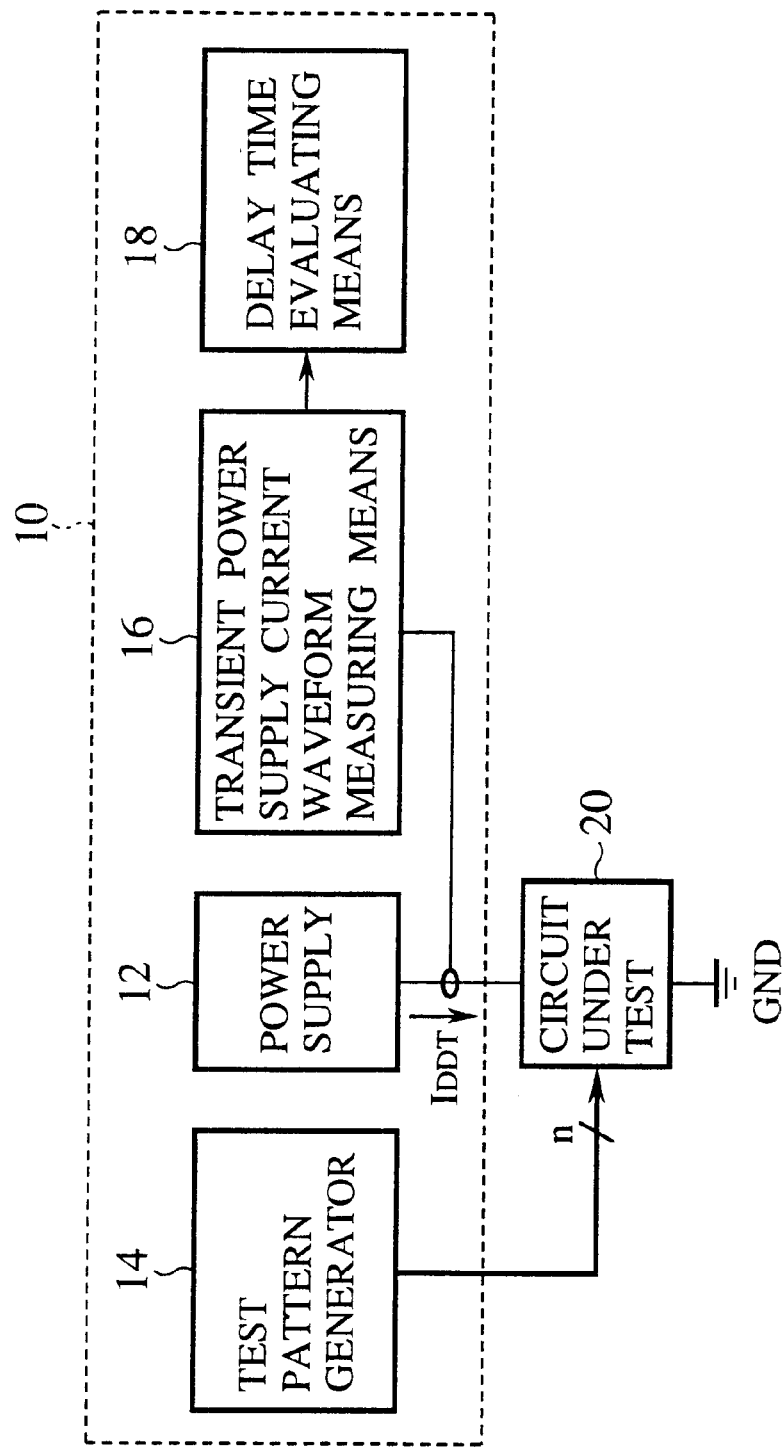
FIG. 6 is a block diagram of delay time measuring apparatus according to the first embodiment of the present invention.
Figure 7:
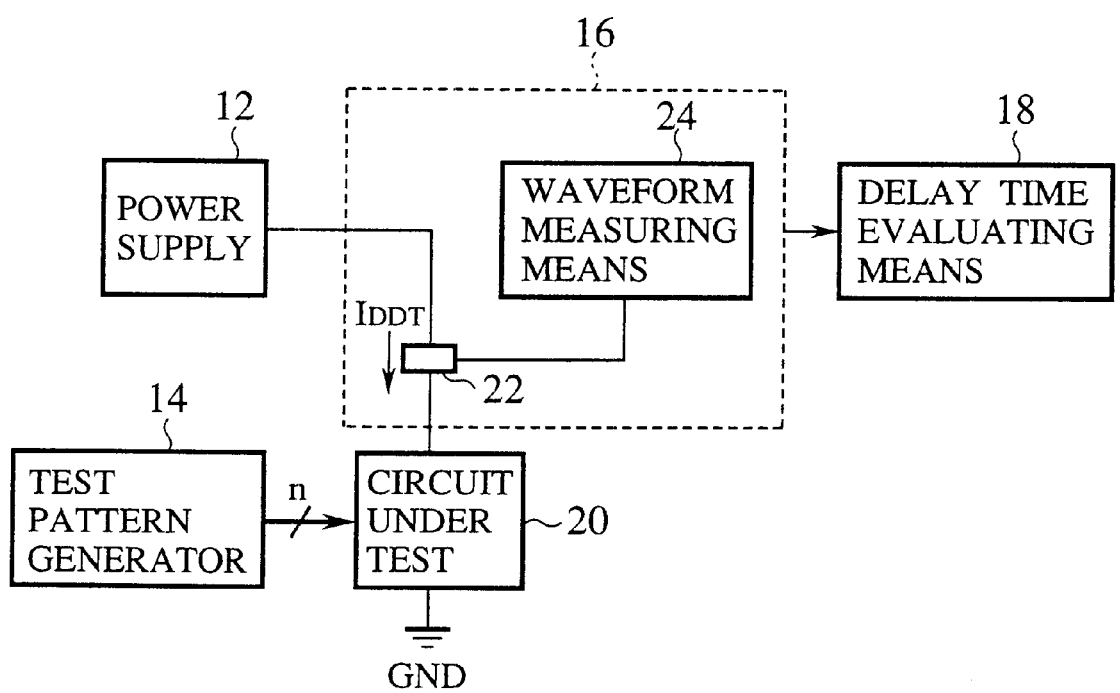
FIG. 7 is a block diagram of an example of transient power supply current waveform measuring means.
Figure 8:
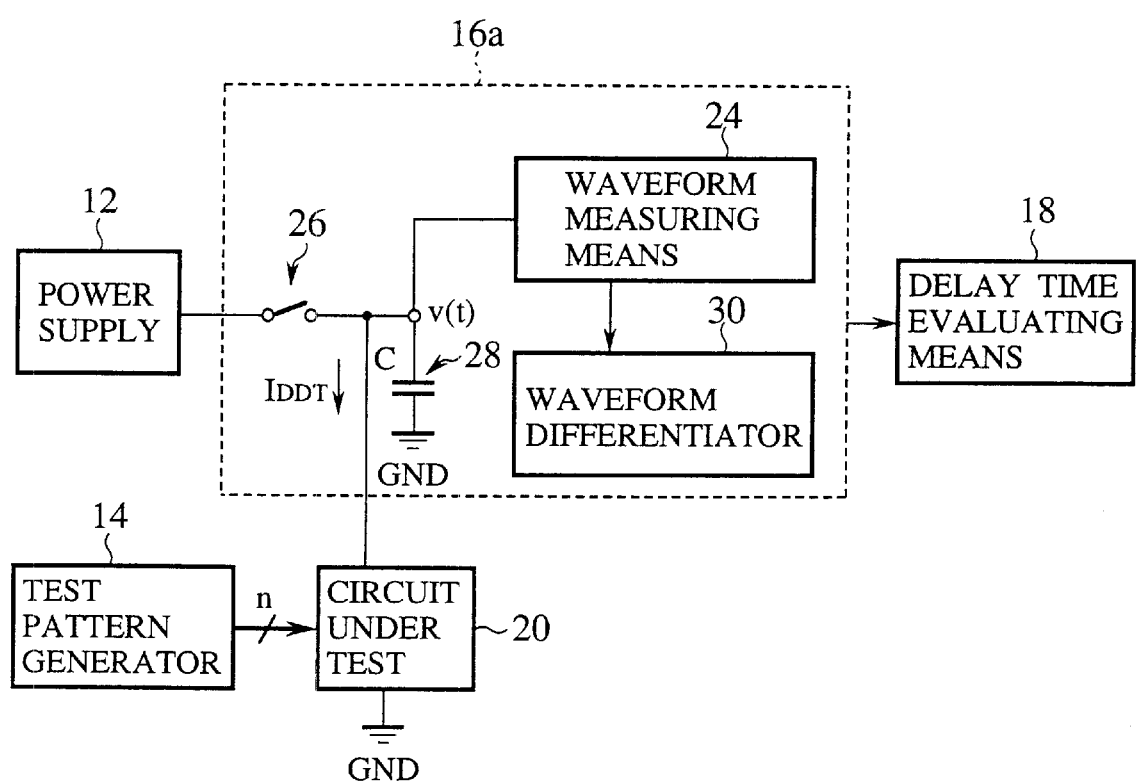
FIG. 8 is a block diagram of another example of the transient power supply current waveform measuring means.

Next, the delay time measuring apparatus according to the present embodiment will be explained with reference to FIG. 6. FIG. 6 is a block diagram of the delay time measuring apparatus according to the present embodiment. FIG. 7 is a block diagram of an example of a transient power supply current waveform measuring means used in the present embodiment. FIG. 8 is a block diagram of another example of the transient power supply current waveform measuring means used in the present embodiment.

As shown in FIG. 6, the delay time measuring means 10 according to the present embodiment comprises a power supply 12, a test pattern generator 14, a transient power supply current waveform measuring means 16 and a delay time evaluating means 18.

The power supply 12 supplies current to a circuit under test 20. The power supply 12 incessantly applies a prescribed voltage to the circuit under test 20 during a test. A prescribed voltage to be applied to the circuit under test 20 is, e.g., 3.3 V.

The power supply 12 can be, e.g., a universal stabilization power supply, programmable automatic test equipment, a large-capacity capacitor, or others. A universal stabilization power supply can be provided by, e.g., a voltage/current generator R6144 made by ADVANTEST CORP. Automatic test equipment can be provided by, e.g., a programmable power supply (PPS), such as LOGIC TESTER T6671E made by ADVANTEST CORP., or others. It is preferable that the power supply 12 is quick in current response. It is also preferable that the power supply 12 is located close to a circuit under test 20.

A test pattern generator 14 inputs a series of test patterns for activating a path under test to a circuit under test 20. The test pattern generator 14 can be provided by a universal digital data generator, automatic test equipment or others. A universal digital data generator can be, e.g., a combination of, Data Time Generator HFS9009 (the main frame) and HFS9DG2 (the data time generator module) both by SONY TEKTRONIX CORP.

Transient power supply current waveform measuring means 16 measures a waveform of transient power supply current $I^{DDT}$ generated when a test pattern is inputted to the circuit under test 20. An example of the constitution of the transient power supply current waveform measuring means 16 will be described later.

A delay time evaluating means 18 measures a pulse width of a waveform of transient power supply current $I_{DDT}$ measured by the transient power supply current waveform measuring means 16 to give a signal propagation delay time of the path under test. The delay time evaluating means 18 may be provided by hardware or software.

Next, an example of the transient power supply current waveform measuring means used in the present embodiment will be explained with reference to FIG. 7. FIG. 7 is a view of the example of the transient power supply current waveform measuring means used in the present embodiment.

As shown in FIG. 7, the transient power supply current waveform measuring means 16 includes a current sensor 22 which transforms a waveform of transient power supply current $I_{DDT}$ to a voltage waveform, and waveform measuring means 24 which measures the voltage waveform transformed by the current sensor 22.

The current sensor 22 can be provided by, e.g., an inductive current sensor, a resistive current sensor or others. The inductive current sensor detects changes of a magnetic field around the power supply line to thereby transform a waveform of transient power supply current to a voltage waveform. The resistive current sensor inserts resistance of a small resistance value into the power supply line to thereby detect voltage waveforms at both ends of the resistance. To prevent generation of ringing in a waveform of transient power supply current due to inductance component of the power supply line, it is preferable that the current sensor 22 is small-sized.

The waveform measuring means 24 can be provided by an oscilloscope, an automatic test equipment or others. An oscilloscope can be provided by, e.g., DIGITAL OSCILLOSCOPE TDS784A made by SONY TEKTRONIX CORP.

Then, another example of the transient power supply current waveform measuring means used in the present embodiment will be explained with reference to FIG. 8. FIG. 8 is a block diagram of said another example of the transient power supply current waveform measuring means used in the present embodiment.

As shown in FIG. 8, the transient power supply current waveform measuring means 16a according to this example includes a switch 26, a capacitor 28, a waveform measuring means 24 and a waveform differentiator 30.

The switch 26 disconnects capacitance component and inductance component of the power supply line to feed from a capacitor 28 all of current flowing into the circuit under test 20. The capacitor 28 supplies current to the circuit under test 20.

The waveform measuring means 24 measures voltage change v(t) at the terminal of the capacitor 28 on the side of the circuit under test 20.

The waveform differentiator 30 time-differentiates a voltage waveform v(t) measured by the waveform measuring means 24. The waveform differentiator 30 can be provided by hardware or software.

Transient power supply current $I_{DDT}$ flowing from the capacitor 28 into the circuit 20 when the circuit under test 20 is in a transient state is expressed by $$I_{DDT} = -C\frac{dv(t)}{dt} \tag{15}$$

In Formula 15, C represents a capacity of the capacitor, and v(t) represents a terminal voltage of the capacitor on the side of the circuit under test.

A voltage waveform v(t) of the capacitor 28 is time-differentiated to thereby give a waveform of transient power supply current $I_{DDT}$ flowing into the circuit under test 20.

(Delay Time Measuring Method)

Figure 9:
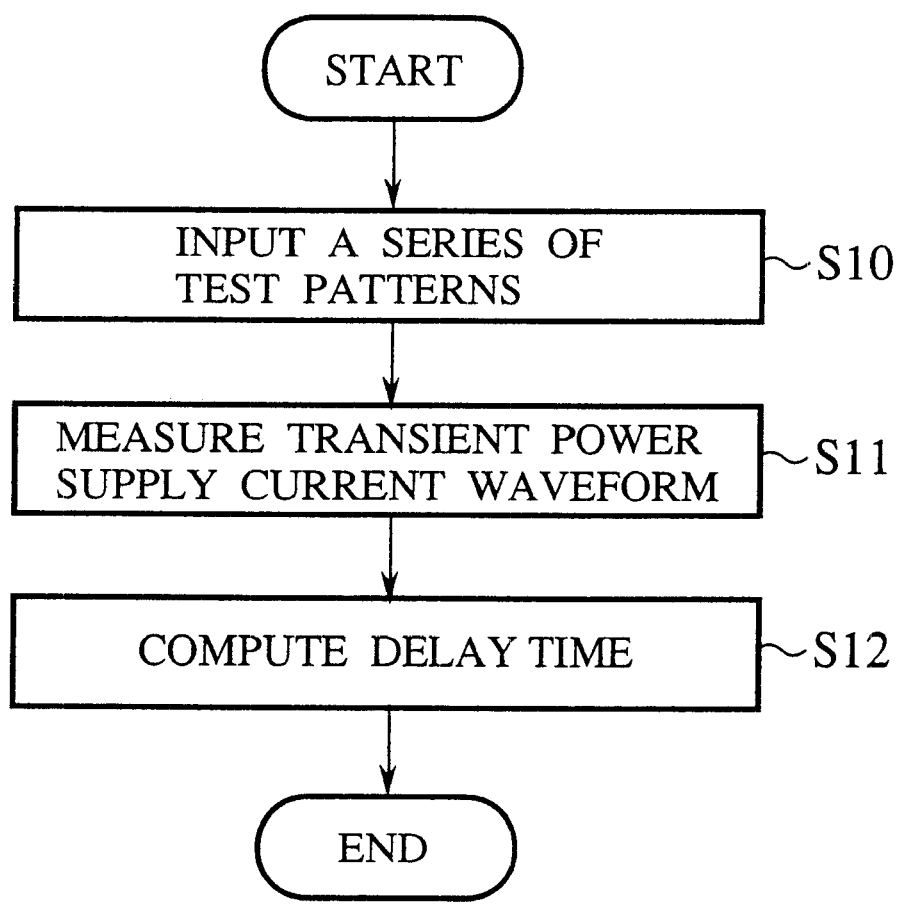
FIG. 9 is a flow chart of the delay time measuring method according to the first embodiment of the present invention.

Next, the delay time measuring method using the delay time measuring apparatus according to the present embodiment will be explained with reference to FIG. 9. FIG. 9 is a flow chart of the delay time measuring method according to the present embodiment.

First, a series of test patterns for activating a path under test is inputted from the test pattern generator 14 (Step 10).

Next, a waveform of transient power supply current $I_{DDT}$ flowing from a power source 12 to the power supply line of the circuit under test 20 is measured by the transient power supply current waveform measuring means 16 (Step 11). The processing in Step 11 and the processing in Step 10 are performed substantially simultaneously with each other. In measuring a waveform of transient power supply current, a waveform may be measured once, but waveforms may be measured several times to give an average for high measurement accuracy. In the case that the measurement is performed once, a series of test patterns is inputted once, and a series of test patterns is inputted several times in the case that the measurement is performed several times.

Then, a delay time of the path under test is computed based on a pulse width of a waveform of transient power supply current $I_{DDT}$ by the delay time evaluation means 18 (Step 12).

Thus, the measurement of a delay time is completed.

As described above, according to the present embodiment, a pulse width of a waveform of transient power supply current is given, thereby measuring a delay time of a path under test.

(Testing Apparatus for Semiconductor Integrated Circuits)

Figure 10:
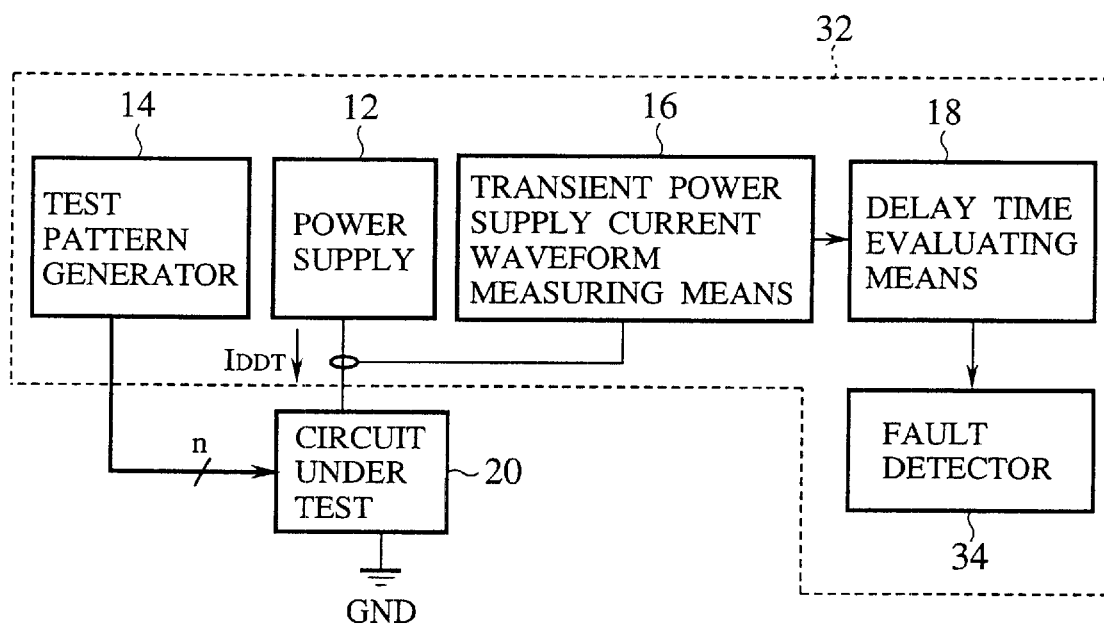
FIG. 10 is a block diagram of the testing apparatus for semiconductor integrated circuits according to the first embodiment of the present invention.

Next, the testing apparatus for semiconductor integrated circuits according to the present embodiment will be explained with reference to FIG. 10. FIG. 10 is a block diagram of the testing apparatus for semiconductor integrated circuits according to the present embodiment.

As shown in FIG. 10, the semiconductor integrated circuits testing apparatus 32 according to the present embodiment further includes a fault detector 34 in addition to the power supply 12, the test pattern generator 14, the transient power supply current waveform measuring means 16 and the delay time evaluating means 18.

The fault detector 34 compares a delay time measured by the delay time evaluating means 18 with a predefined value to thereby judge absence and presence of a fault.

Because of the fault detector 34 which judges absence and presence of a fault, the testing apparatus for semiconductor integrated circuits according to the present embodiment can judge absence and presence of a fault in a path under test.

(Testing Method for Semiconductor Integrated Circuits)

Figure 11:
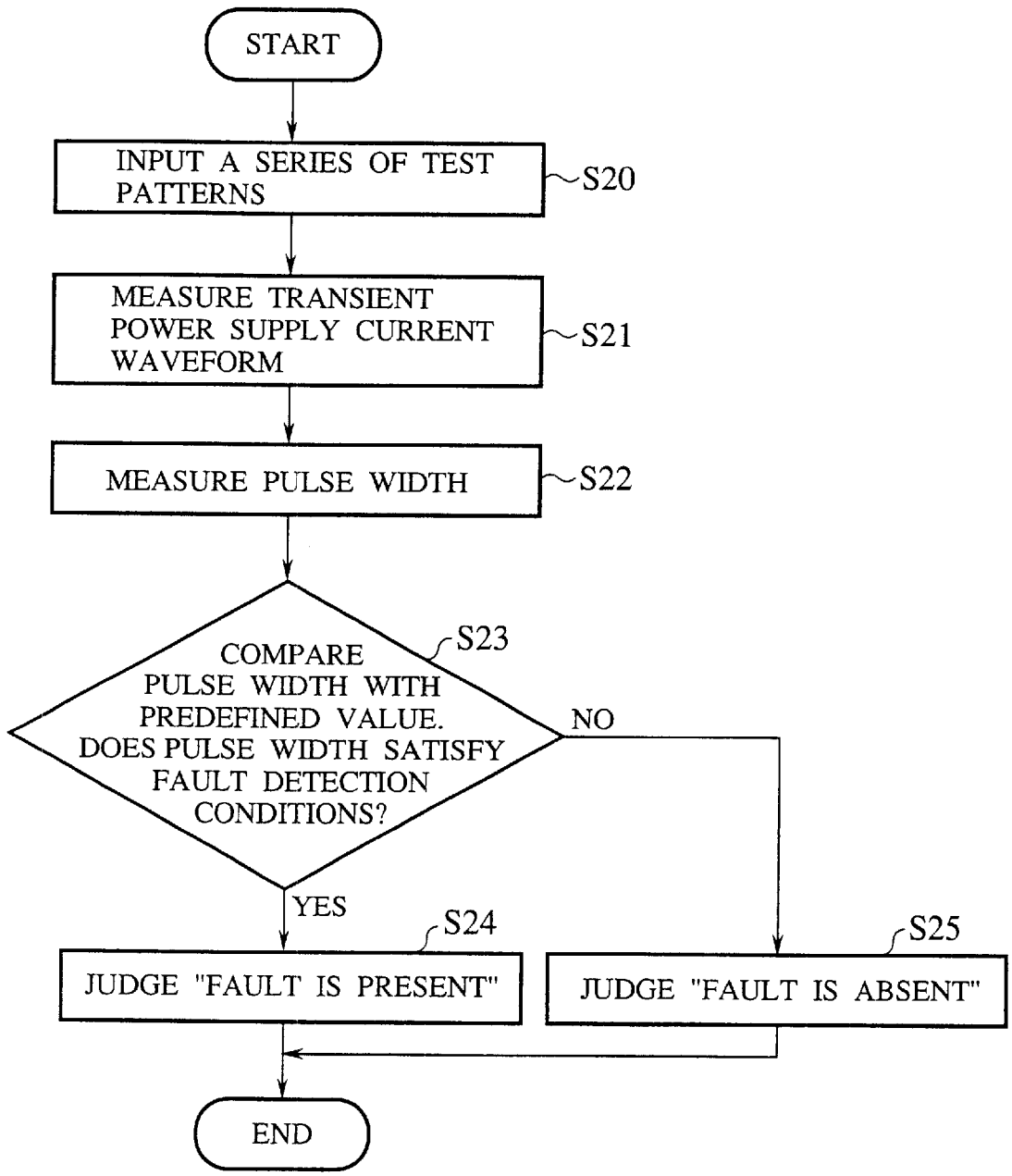
FIG. 11 is a flow chart of the testing method for semiconductor integrated circuits according to the first embodiment of the present invention.

Next, the testing method for semiconductor integrated circuits using the semiconductor integrated circuit testing apparatus shown in FIG. 10 will be explained with reference to FIG. 11. FIG. 11 is a flow chart of the testing method for semiconductor integrated circuits according to the present embodiment.

First, a series of test patterns for activating a path under test is inputted by the test pattern generator 14 (Step 20).

A waveform of transient power supply current $I_{DDT}$ flowing from the power supply 12 to the power supply line of the circuit under test 20 is measured by the transient power supply current waveform measuring means 16 (Step 21). The processing in Step 21 and the processing in Step 20 are performed substantially simultaneously with each other. The measurement of a waveform of transient power supply current may be performed once, or the measurement may be performed a plurality of times to give an average value for higher measurement accuracy.

Next, a pulse width of a waveform of the transient power supply current $I_{DDT}$ is measured by the delay time evaluating means 18 (Step 22).

Then, a pulse width of the waveform of the transient power supply current $I_{DDT}$ is compared with a predefined value by the fault detector 34 (Step 23).

When a result of the comparison of the pulse width of the waveform of the transient power supply current $I_{DDT}$ and a predefined value satisfies a fault detection condition, the fault detector 34 judges "Fault is present" (Step 24).

When a result of the comparison of the pulse width of the waveform of the transient power supply current $I_{DDT}$ and a predefined value does not satisfy the fault detection condition, the fault detector 34 judges "Fault is Absent".

Thus, the processing is completed.

Figure 12:
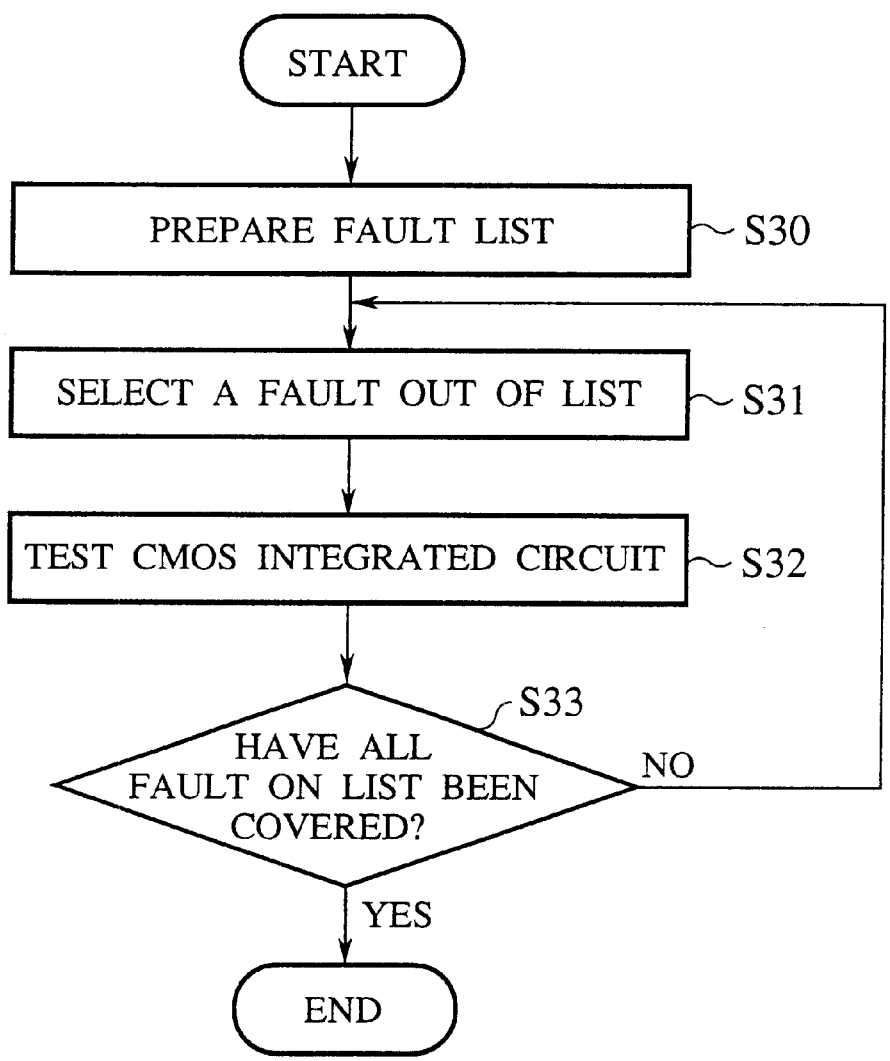
FIG. 12 is a flow chart of the testing method in which the test is repeated.

As shown in FIG. 12, the above-described processing is repeated until contents of all faults of the circuit under test 20, which are to be detected are covered. FIG. 12 is a flow chart of the testing method in the case that the testing is repeated.

First, as shown in FIG. 12, a list of faults to be detected is prepared. A fault list is suitably prepared so that required testing can be performed (Step 30).

Then, out of the list of faults, contents of a fault which is to be detected are suitably selected (Step 31).

Then, in accordance with the selected fault contents, the testing is performed on the semiconductor integrated circuit (Step 32).

Next, it is judged whether the testing has covered all the fault contents of the list (Step 33). When all the fault contents of the list have been covered by the testing, the testing are completed.

(Delay Fault Testing Method)

Figure 13:
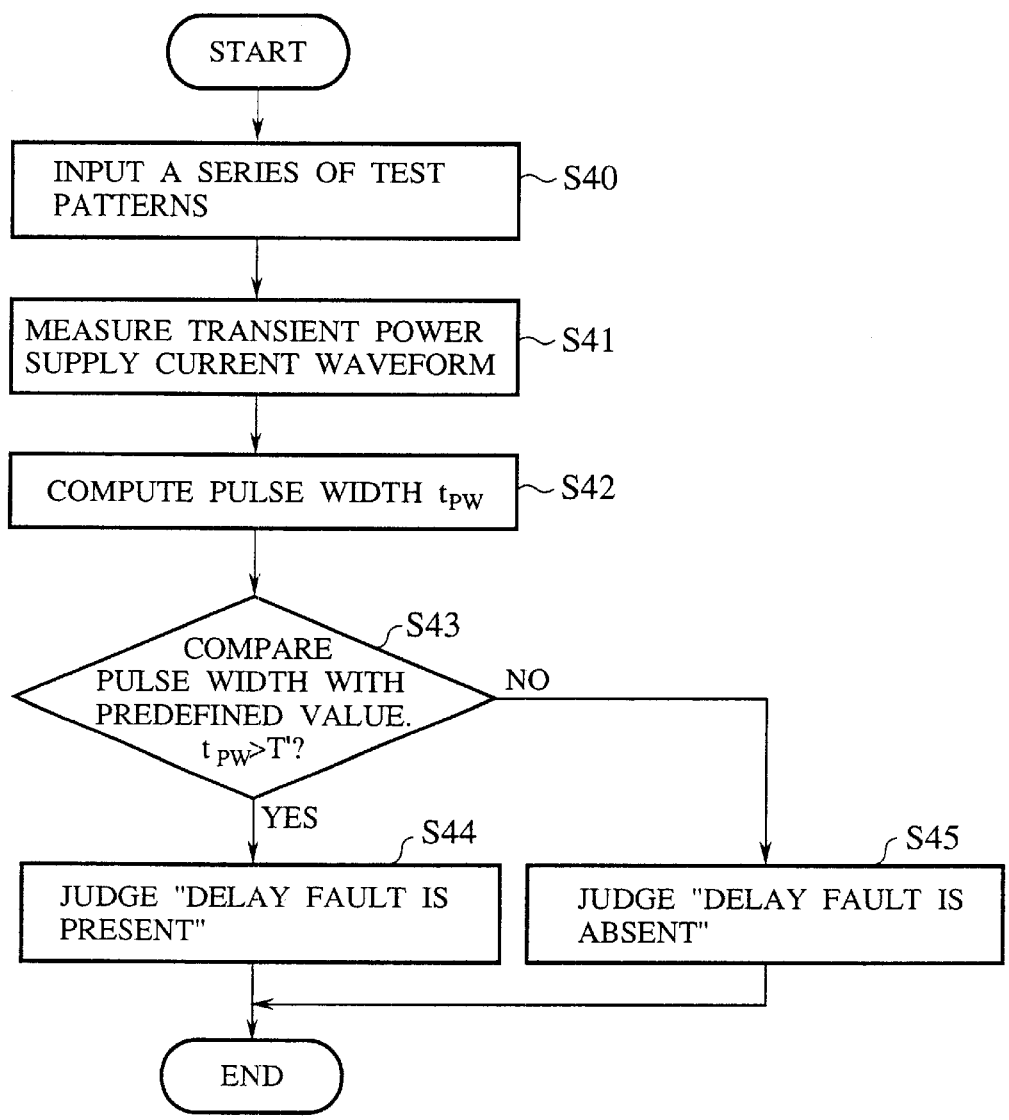
FIG. 13 is a flow chart of the delay fault testing method according to the first embodiment of the present invention.

Next, the testing method for detecting a delay fault according to the present embodiment will be explained with reference to FIG. 13. FIG. 13 is a flow chart of the method for detecting a delay fault according to the present embodiment.

As shown in FIG. 13, a series of test patterns for activating a path under test is inputted by the test pattern generator 14 (Step 40).

Then, a waveform of transient power supply current $I_{DDT}$ flowing from the power supply 12 to the power supply line of a circuit under test 20 is measured (Step 41). The processing in Step 41 and the processing in Step 40 are performed substantially simultaneously with each other. A waveform of transient power supply current $I_{DDT}$ may be measured once, or waveforms may be measured a plurality of times to give an average value for high measurement accuracy.

Then, a pulse width $t_{PW}$ of the waveform of the transient power supply current $I_{DDT}$ is given by the delay time evaluating means 18 (Step 42).

Then, the pulse width $t_{PW}$ is compared with a predefined value by the fault detector 34. Specifically, the pulse width $t_{PW}$ is compared with an upper limit T' of an allowable delay time (Step 43).

When a result of the comparison between the pulse width $t_{PW}$ and the predefined value T' is $t_{PW}$>T', the fault detector 34 judges "Delay Fault is Present" as in Formula 13 (Step 44).

When a result of the comparison between the pulse width $t_{PW}$ and the predefined value T' is $t_{PW}$≦T', the fault detector 34 judges "Delay Fault is Absent" (Step 45).

Thus, the processing of the testing for the delay fault detection is completed. The delay fault testing is repeated as explained above with reference to FIG. 12 until all contents of faults of a circuit under test, which are to be detected are covered by the delay fault testing.

(Stuck-at Fault Testing Method)

Next, the stuck-at fault testing method according to the present embodiment will be explained with reference to FIG. 14. FIG. 14 is a flow chart of the stuck-at fault testing method according to the present embodiment.

First, a series of test patterns for activating a path under test is inputted by the test pattern generator 14 (Step 50).

Next, a waveform of transient power supply current $I_{DDT}$ flowing from the power supply 12 to the power supply line of a circuit under test 20 is measured by the transient power supply current waveform measuring means 16 (Step 51). The processing of Step 51 and the processing of Step 50 are performed substantially simultaneously with each other. A waveform of the transient power supply current may be measured once, or waveforms are measured a plurality of times to give an average value for higher measurement accuracy.

Next, a pulse width $t_{PW}$ of the waveform of the transient power supply current $I_{DDT}$ is given by the delay time evaluating means 18 (Step 52).

Then, the pulse width $t_{PW}$ of the waveform of the transient power supply current $I_{DDT}$ given by the delay time evaluating means 18 is compared with a predefined value by the fault detector 34. A predefined value can be, e.g., a lower limit value $t_{pd,typ}-\Delta_t$ of an allowable delay time in consideration of fabrication variations, etc. of the semiconductor integrated circuit (Step 53).

Then, when a result of the comparison between the pulse width $t_{PW}$ and a predefined value is $t_{PW}<t_{pd,typ}-\Delta_t$, the fault detector 34 judges "Stuck-at Fault is Present" as shown in Formula 14 (Step 54).

When a result of the comparison between the pulse width $t_{PW}$ and the predefined value is $t_{PW}\geq t_{pd,typ}-\Delta_t$, the fault detector 34 judges "Stuck-at Fault is Absent" (Step 55).

Thus, the stuck-at fault testing is thus completed. As explained above with reference to FIG. 12, the stuck-at fault testing is repeated until all contents of faults of a circuit under test, which are to be detected are covered.

As described above, according to the present embodiment, a pulse width of a waveform of transient power supply current is given, whereby a path delay time of a path under test can be readily measured. In the present embodiment, a waveform of transient power supply current is detected, which can be more easily measured than a voltage signal.

According to the present embodiment, a waveform of transient power supply current is measured, so that a path under test which cannot produce an output signal at the outside can be tested. According to the present embodiment, the test can be performed by inputting a series of arbitrarily generated patterns, which can simplify the testing procedure. According to the present embodiment, input values of side inputs are not especially restricted, which facilitates the testing.

According to the present embodiment, a pulse width of a waveform of transient power supply current is given, and the pulse width and an upper limit value of an allowable delay time are compared with each other to thereby detect absence and presence of a delay fault of a path under test. In the present embodiment, since the test patterns which can simultaneously activate a plurality of paths are available, delay faults of the plural paths can be concurrently tested.

According to the present embodiment, a pulse width of a waveform of transient power supply current is given, and the pulse width and a value given in consideration of fabrication variations are compared with each other to thereby detect absence and presence of a stuck-at fault of a path under test.

Second Embodiment

Figure 15A:
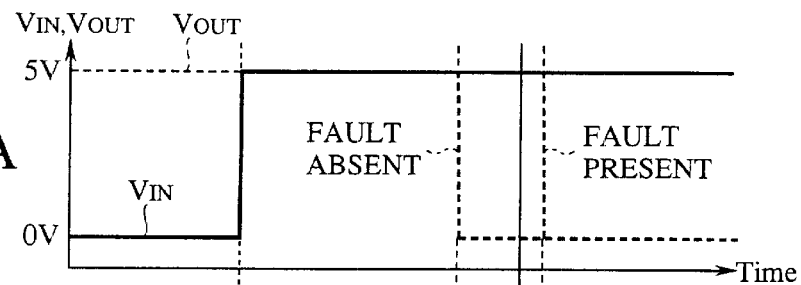
FIGS. 15A and 15B are time charts of a basic principle of the testing method for semiconductor integrated circuits according to a second embodiment of the present invention.
Figure 15B:
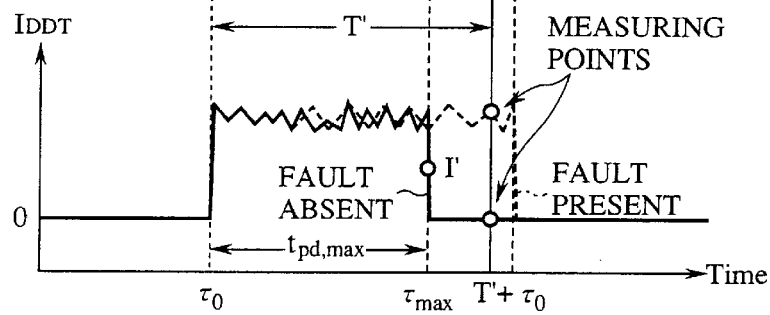

Before the testing method for semiconductor integrated circuits according to second embodiment of the present invention, etc. are explained, a basic principle on which the second embodiment is based on will be explained with reference to FIGS. 15A and 15B. FIGS. 15A and 15B are time charts showing the basic principle of the testing method for semiconductor integrated circuits according to the present embodiment. FIG. 15A shows input/output voltage characteristics of a path under test. FIG. 15B shows a waveform of transient power supply current.

As shown in FIGS. 2A and 2B, transient power supply current $I_G$ of a logic gate monotonously decreases after it has arrived at a peak value. Accordingly, power supply current flowing into a circuit under test monotonously decreases after a timing when an output transition of a logic gate of the path under test, which has been last switched.

That is, in a semiconductor integrated circuit having no fault, when an output transition timing of a logic gate which last switches is represented by $\tau_{max}$, and an instantaneous value of transient power supply current at a timing $\tau_{max}$ is represented by I', the transient power supply current of the semiconductor integrated circuit does not increase to be above I' after the timing $\tau_{max}$.

The testing method for semiconductor integrated circuits according to the present embodiment is based on the above-described basic principle, and is characterized mainly in that an instantaneous value of transient power supply current of the semiconductor integrated circuit is measured at a prescribed timing to thereby detect a path delay fault of the circuit under test.

A current value I' as a reference for judging a fault can be a value of power supply current at a time, e.g., when an output of a last logic gate of a path under test has a value which is half a power supply voltage. This value can be given by, e.g., simulating a circuit-to-be-tested, statistic data given by using actual devices, etc.

As shown in FIGS. 15A and 15B, in the testing method according to the present embodiment, an instantaneous value of transient power supply current of a circuit under test at a prescribed timing is measured, and the instantaneous value is compared with an instantaneous value of transient power supply current of an idealistic current having no delay fault, whereby absence and presence of a fault is judged.

It is assumed that in a logic circuit a plurality of paths $P_1$, $P_2$, ..., $P_n$ are activated by test patterns $T=<V_1, V_2>$. When a timing when the j-th logic gate from the input of the path $P_i$ is switched is represented by $\tau_{ij}$, a timing $\tau_{max}$ when an output transition of a logic gate $G_{final}$ which switches last of the paths $P_1, P_2, \ldots, P_n$ is expressed by $$\tau_{max} = \max_{ij}\{\tau_{ij}\}, 1 \leq i \leq n, 1 \leq j \quad (16)$$

Accordingly, a maximum value $t_{pd,max}$ of path delay times of the path $P_1, P_2, \ldots, P_n$ is expressed as a time interval between a timing $\tau_{max}$ and a timing $\tau_0$ of an input transition given by $$t_{pd,max} = \tau_{max} - \tau_0 \quad (17)$$

As described above, a timing of an output transition of a logic gate agrees with a timing of a peak or falling edge of transient power supply current of the logic gate. Accordingly, a timing $\tau_{max}$ corresponds to a timing $\tau_{IDD}$ of a final peak of a waveform or a falling edge of transient power supply current $I_{DDT}$ of the circuit.

Power supply current $I_G$ of a logic gate can be approximated to a triangular waveform as shown in FIG. 2B, and $G_{final}$ represents a logic gate which switches last. When the circuit is normal, power supply current has not peak after a timing $\tau_{max}$.

Accordingly, at $t \geq \tau_{max}$, a power supply current waveform function $i_{DDT}(t)$ monotonously decreases.

That is, when a time function of power supply current waveform is represented by $i_{DDT}(t)$, and an instantaneous value of power supply current at a timing $\tau_{max}$ is represented by I', $$I' \equiv i_{DDT}(\tau_{max}) \quad (18)$$

$$i_{DDT}(t) \leq i_{DDT}(\tau_{max}) = I', t \leq \tau_{max} \quad (19)$$

can be given.

In order that a circuit normally operates, a maximum delay time $t_{pd,max}$ is smaller than an upper limit value T' ($=T_{CLK}-T_{SKEW}-T_{SU}$). Accordingly, $$t_{pd,max} = \tau_{max} - \tau_0 < T' \quad (20)$$

is given.

Accordingly, when a circuit has no fault, when $t=T'+\tau_0 > \tau_{max}$, $$i_{DDT}(T'+\tau_0) \leq I' \quad (21)$$

can be derived from Formula 19.

When $T'+\tau_0$, an instantaneous value of transient power supply current $I_{DDT}$ is larger than an instantaneous value I' of the transient power supply current, $$i_{DDT}(T'+\tau_0) > I' = i_{DDT}(\tau_{max}) \quad (22)$$

can be given.

Because $T'+\tau_0$ is never larger than an output transition timing $\tau_{max}$, $$\tau_{max} > T'+\tau_0 \quad (23)$$

$$\therefore t_{pd,max} = \tau_{max} - \tau_0 > T' \quad (24)$$

can be given.

Accordingly, in this case, in a path having a largest maximum delay time $t_{pd,max}$, propagation of a signal cannot be in time for a clock used in the semiconductor integrated circuit. That is, in this case, a delay fault is present.

As described above, when power supply current value $i_{DDT}(T'+\tau_0)$ is larger than an instantaneous current value I' at a prescribed timing $T'+\tau_0$, it is considered that a path delay fault is present in one of the activated paths under test.

In contrast to this, when power supply current value $i_{DDT}(T'+\tau_0)$ is smaller than an instantaneous current value I', it is considered that no path delay fault is present in any of the activated paths under test.

Accordingly, $$\begin{cases} \text{Delay fault is absent,} & i_{DDT}(T'+\tau_0) \leq I' \\ \text{Delay fault is present,} & i_{DDT}(T'+\tau_0) > I' \end{cases} \quad (25)$$

is given.

As described above, according to the present embodiment, a current value of transient power supply current at a prescribed timing is compared with a power supply current value of a semiconductor integrated circuit having no fault at the prescribed timing, whereby a delay fault of the circuit can be easily detected.

The testing method according to the present embodiment can be made to detect not only delay faults but also stuck-at faults. The testing for detecting stuck-at faults can be made by suitably setting a timing for measuring a power supply current value.

(Testing Apparatus for Semiconductor Integrated Circuits)

Figure 16:
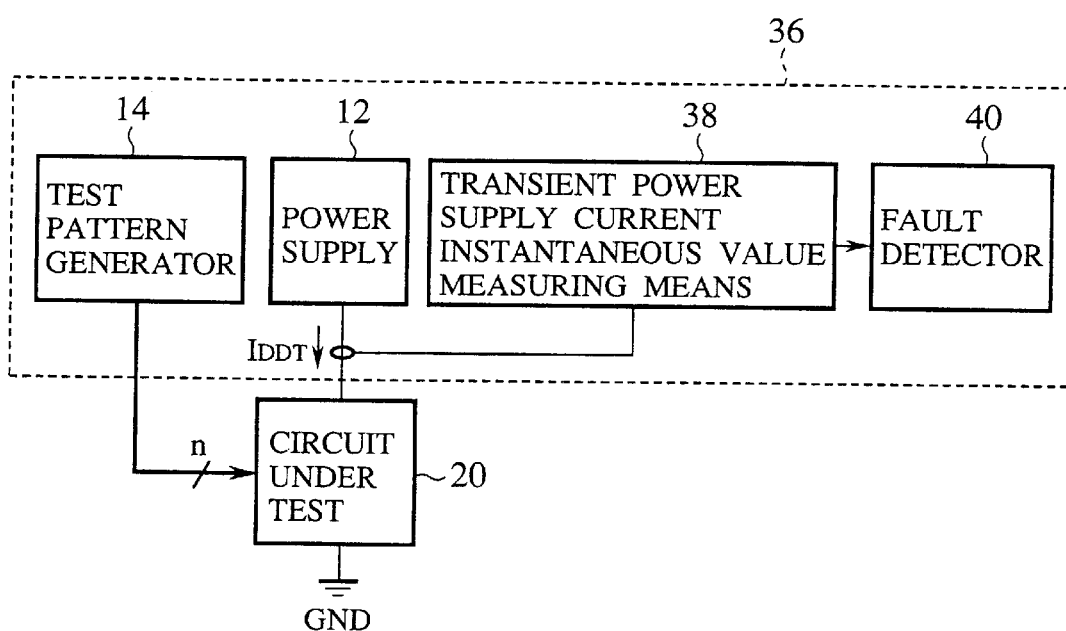
FIG. 16 is a view of the testing apparatus for semiconductor integrated circuits according to the second embodiment of the present invention.

Then, the testing apparatus for semiconductor integrated circuits according to the present embodiment will be explained with reference to FIG. 16. FIG. 16 is a view showing the testing apparatus for semiconductor integrated circuits according to the present embodiment. The same members of the present embodiment as those of the testing apparatus for semiconductor integrated circuits according to the present embodiment, etc. shown in FIGS. 6 to 10 are represented by the same reference numbers and the explanation of which is not repeated here.

The semiconductor integrated circuit testing apparatus 36 according to the present embodiment includes a power supply 12, a test pattern generator 14, a transient power supply current instantaneous value measuring means 38 and a fault detector 40.

The transient power supply current instantaneous value measuring means 38 measures an instantaneous value $i_{DDT}(t)$ of transient power supply current at a prescribed timing $\tau$.

The fault detector 40 compares a transient power supply current value $i_{DDT}(\tau)$ measured by the transient power supply current instantaneous value measuring means 38 with a prescribed current value I' to thereby judge absence and presence of a delay fault. The fault detector 40 may be provided by hardware or software.

Figure 17:
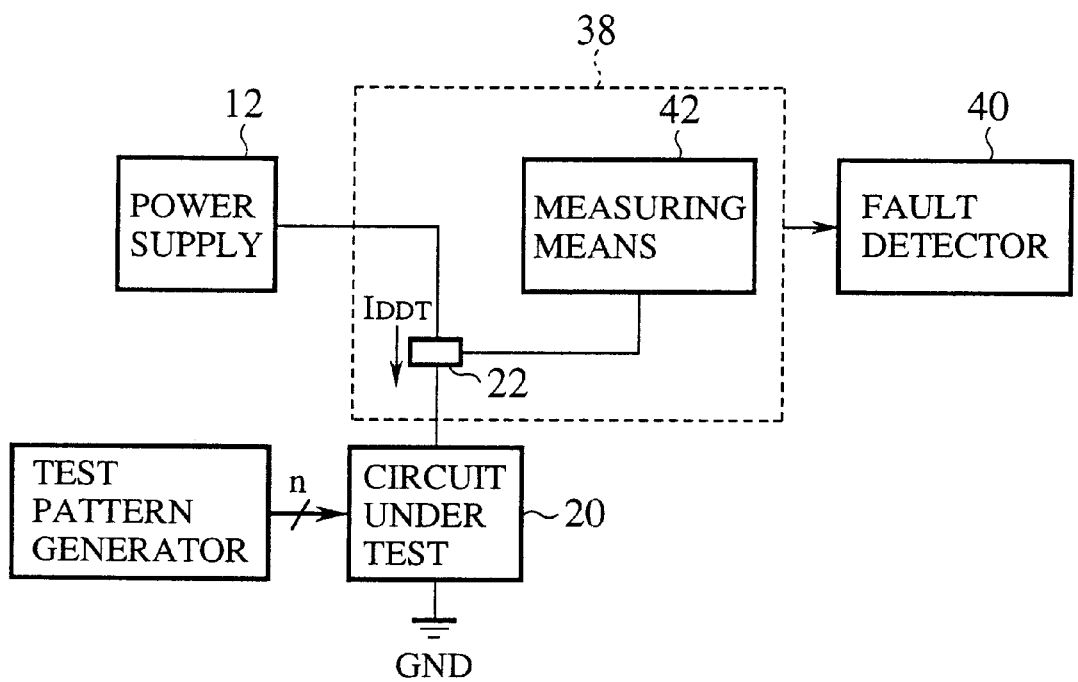
FIG. 17 is a view of an example of transient power supply current instantaneous value measuring means.

Next, an example of the transient power supply current instantaneous value measuring means used in the present embodiment will be explained with reference to FIG. 17. FIG. 17 is a block diagram of the example of the transient power supply current instantaneous value measuring means used in the present embodiment.

As shown in FIG. 17, the transient power supply current instantaneous value measuring means 38 includes a current sensor 22 which transforms a current signal to a voltage signal, and measuring means 42 which measures a voltage value transformed by the current sensor 22. The measuring means 42 can be provided by a digital multimeter, an oscilloscope or automatic test equipment. The digital multimeter can be provided by, e.g., DIGITAL MULTIMETER R6581 by ADVANTEST CORP. The automatic test equipment can be provided by, e.g., the same one as that of the first embodiment.

Figure 18:
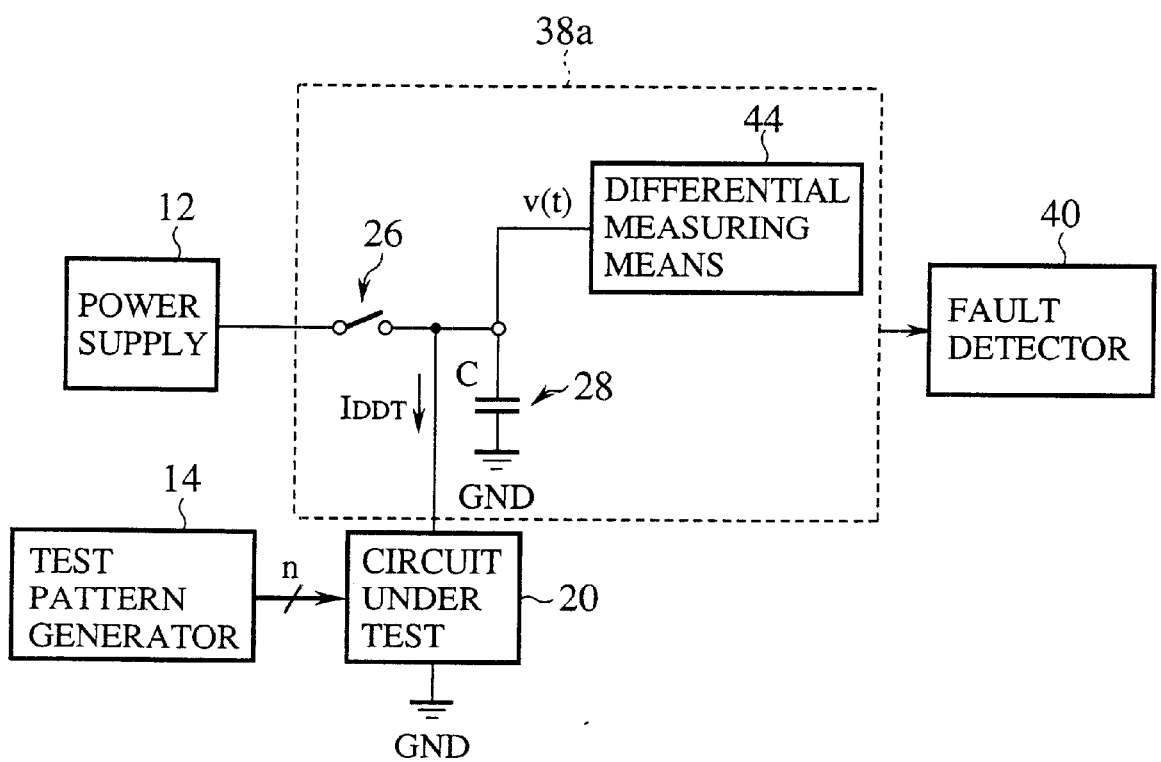
FIG. 18 is a view of another example of the transient power supply current instantaneous value measuring means.

Then, another example of the transient power supply current instantaneous measuring means used in the present embodiment will be explained with reference to FIG. 18. FIG. 18 is a block diagram showing the another example of the transient power supply current instantaneous value measuring means used in the present embodiment.

As shown in FIG. 18, the transient power supply current instantaneous value measuring means 38a includes a switch 26 which turns off a power supply line, a capacitor 28 which supplies current to a circuit under test, and a differential measuring means 44 which measures an instantaneous differential value of a voltage waveform v(t) at the terminal of the capacitor 28 on the side of the circuit under test.

The differential measuring means 44 may be provided by, e.g., digital multimeter, oscilloscope or automatic test equipment or others.

Current flowing from the capacitor 28 to a circuit under test 20 when the circuit under test 20 has a transient state, i.e., transient power supply current $I_{DDT}$ is expressed by $$I_{DDT} = -C\frac{dv(t)}{dt} \quad (26)$$

wherein C represents a capacity of the capacitor, and v(t) represents a terminal voltage of the capacitor on the side of a circuit under test.

Accordingly, a time differential value of a voltage waveform v(t) at a timing $\tau$ is measured, whereby an instantaneous value $i_{DDT}(\tau)$ of transient power supply current flowing through the circuit under test.

An instantaneous differential value of a voltage waveform v(t) at a timing $\tau$ can be given by measuring instantaneous values of voltage waveforms near the timing $\tau$ at a very short time interval $\Delta_t$ and dividing a difference between the measured values by the time interval $\Delta_t$.

Accordingly, an instantaneous differential value at a timing $\tau$ is expressed $$\left(\frac{dv(t)}{dt}\bigg|\right)_{t=\tau} = \frac{v(\tau+\Delta_t)-v(\tau)}{\Delta_t} \quad (27)$$

In order to obtain an accurate instantaneous differential value it is preferable that a very short time interval $\Delta_t$ is as short as possible.

(Delay Fault Testing Method)

Figure 19:
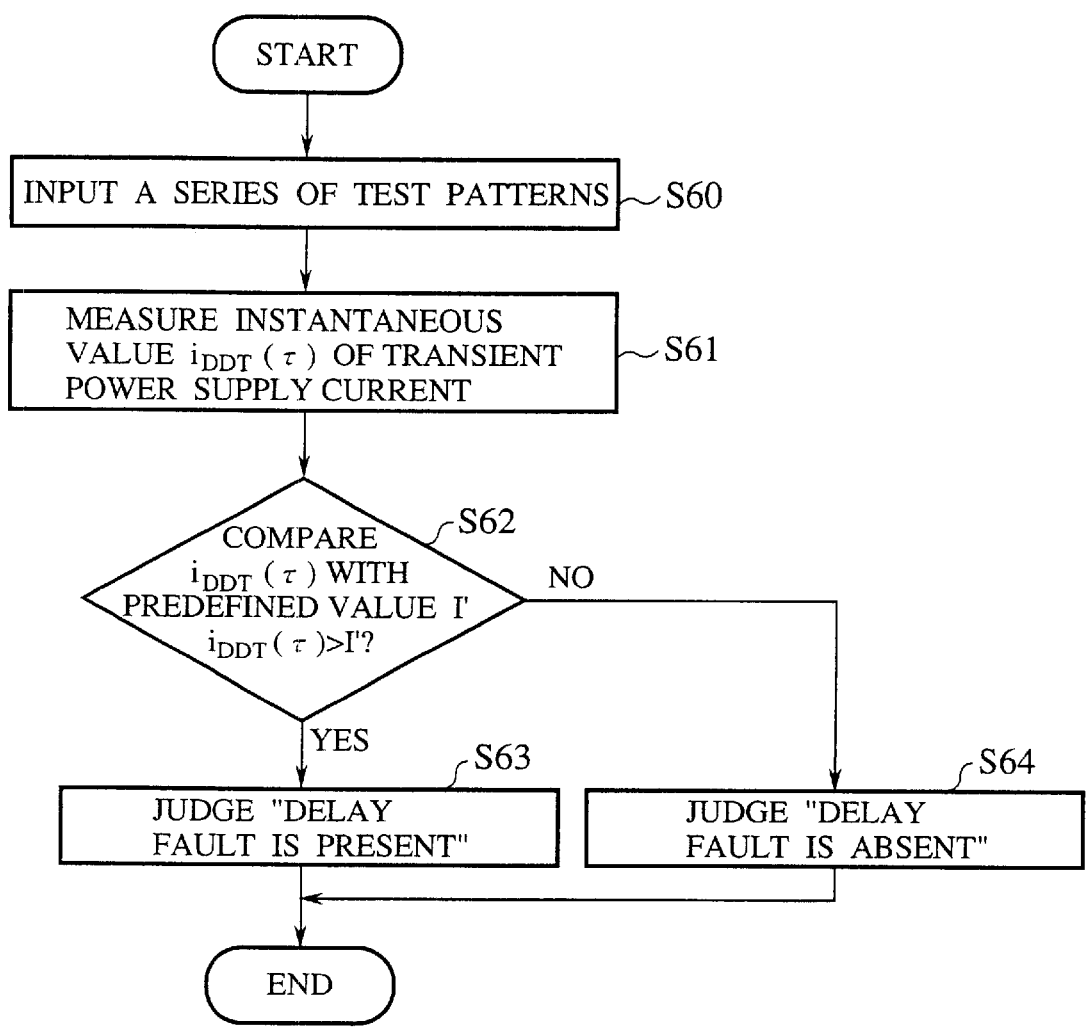
FIG. 19 is a flow chart of the delay fault testing method according to the second embodiment of the present invention.

Then, the delay fault testing method according to the present embodiment will be explained with reference to FIG. 19. FIG. 19 is a flow chart of the delay fault testing method according to the present embodiment.

First, a series of test patterns for activating a path under test is inputted by the test pattern generator 14 (Step 60).

Then, an instantaneous value $i_{DDT}(\tau)$ of transient power supply current at a prescribed timing $\tau$, which flows from the power supply 12 into the power supply line of a circuit under test 20 is measured by the transient power supply current instantaneous value measuring means 38 (Step 61). The processing of Step 61 is performed substantially simultaneously with the processing of Step 60. An instantaneous value $i_{DDT}(\tau)$ may be measured once, or instantaneous values $i_{DDT}(\tau)$ are measured a plurality of times to give an average value for higher accuracy. A timing $\tau$ can be given by, e.g., $\tau=T'+\tau_0$ where $\tau_0$ represents a input transition timing, and T' represents a maximum value of an allowable delay time.

Next, the instantaneous value $i_{DDT}(\tau)$ of transient power supply current is compared with a predefined value I' by the fault detector 40. The instantaneous value $i_{DDT}(\tau)$ is compared with, for example, a typical value $I'(=i_{DDT}(\tau_{max}))$ at an output transition timing $\tau_{max}$ of a logic gate $G_{final}$ of a circuit having no fault, which switches last (Step 62).

When a result of the comparison between the instantaneous value $i_{DDT}(\tau)$ of transient power supply current and the prescribed value I' is $i_{DDT}(\tau)>I'$, the fault detector 40 judges "Delay Fault is Present" (Step 63).

When a result of the comparison between the instantaneous value $i_{DDT}(\tau)$ of transient power supply current and the prescribed value I' is $i_{DDT}(\tau) \leq I'$, the fault detector 40 judges "Delay Fault is Absent" (Step 64).

Thus, the processing of the delay fault testing is completed. The above-described steps are repeated, as shown in FIG. 12, until all contents of faults of the circuit under test, which are to be detected are covered.

Stuck-at faults can be detected by suitably changing fault detection conditions.

As described above, according to the present embodiment, a delay fault and stuck-at fault are evaluated by using an instantaneous value of transient power supply current at a prescribed timing, whereby absence and presence of a delay fault and a stuck-at fault in a path under test of a semiconductor integrated circuit can be easily judged.

Third Embodiment

Before the testing method for semiconductor integrated circuits according to a third embodiment of the present invention, etc. are explained, a basic principle on which the present invention based on will be explained.

As explained in the first embodiment with reference to FIGS. 1A to 1D, when an input signal of an inverter transits from "1" to "0", a short-circuit current flows in the inverter, and charge current $I_c$ flows into a parasitic capacitance $C_{load}$ of an output signal line of the inverter.

Accordingly, when a falling transition takes place in an input signal to the inverter, transient current flowing from the power supply into the inverter is expressed by $$I_{Gf}=I_{Sf}+I_C \quad (28)$$

wherein transient current is represented by $I_{Gf}$, short-circuit current is represented by $I_{Sf}$ and charge current is represented by $I_C$.

On the other hand, when an input signal of the inverter transits from "0" to "1", discharge current $I_D$ flows from an output signal line to the ground, but current flowing from the power supply into the inverter is the short-circuit current alone.

Transient current flowing from the power supply into the inverter when a rising transition takes place in an input signal of the inverter is expressed by $$I_{Gr}=I_{Sr} \quad (29)$$

wherein transient current is represented by $I_{Gr}$ and short-circuit current is represented by $I_{Sr}$.

Figure 20A:
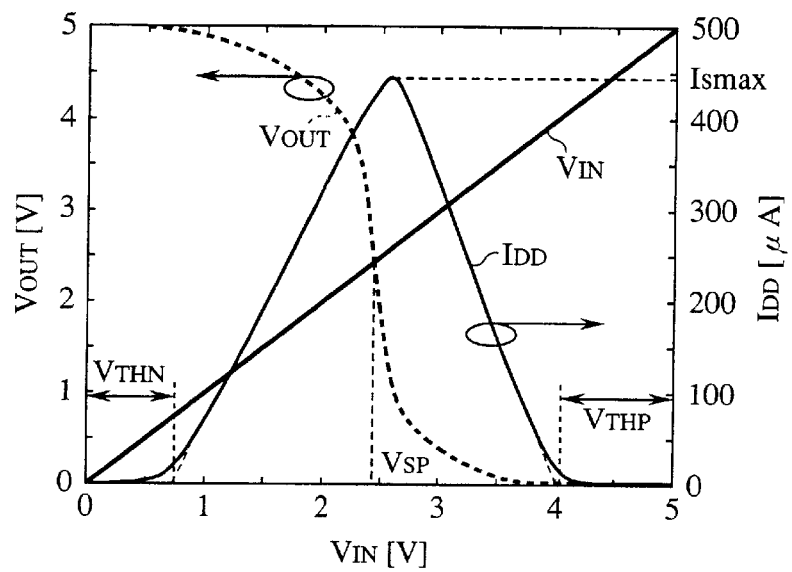
FIGS. 20A and 20B are enlarged views of transient response waveforms of a CMOS inverter.

FIG. 20A is an enlarged view of a transient response waveform of a CMOS inverter. As shown in FIG. 20A, current $I_{DD}$ flowing into the CMOS inverter changes into a triangular pulse corresponding to an input voltage change $V_{IN}$.

Figure 20B:
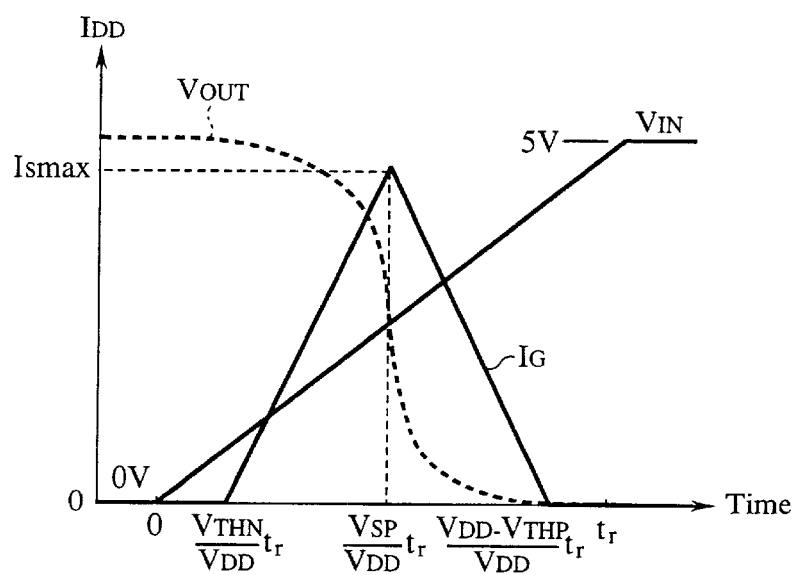

FIG. 20B is a view of an approximated transient response waveform of the CMOS inverter. As shown in FIG. 20B, short-circuit current $I_G$ flowing in the CMOS inverter can be approximated to a triangular pulse.

Accordingly, short-circuit current $I_{Sr}$ flowing from the power supply into the inverter when a rising transition takes place in an input signal of the inverter can be approximated by $$I_{Sr} = \begin{cases} 0, & t \leq \frac{V_{THN}}{V_{DD}} t_r \\ \frac{V_{DD} \cdot I_{Smax}}{(V_{SP} - V_{THN}) \cdot t_r} t - \frac{V_{THN} \cdot I_{Smax}}{(V_{SP} - V_{THN})}, & \frac{V_{THN}}{V_{DD}} t_r < t \leq \frac{V_{SP}}{V_{DD}} t_r \\ \frac{V_{DD} \cdot I_{Smax}}{(V_{SP} - V_{DD} + V_{THP}) \cdot t_r} t - \frac{(V_{DD} - V_{THP}) \cdot I_{Smax}}{(V_{SP} - V_{DD} + V_{THP})}, & \frac{V_{SP}}{V_{DD}} t_r < t \leq \frac{V_{DD} - V_{THP}}{V_{DD}} t_r \\ 0, & t > \frac{V_{THP} - V_{THP}}{V_{DD}} t_r \end{cases} \quad (30)$$

In Formula 30, $I_{Smax}$ represents a maximum value of short-circuit current of the inverter, $V_{DD}$ represents power supply voltage, $V_{THN}$ represents a threshold voltage of the n-MOS transistor, $V_{THP}$ represents a threshold voltage of the p-MOS transistor, and $t_r$ represents a rising transition time of an input signal. Note, a threshold voltage $V_{THP}$ has an absolute value. For simplification of the approximation formula, a transition start timing of input voltage $V_{IN}$ is 0.

A waveform of short-circuit current $I_{Sf}$ flowing from the power supply into the inverter when a falling transition takes place in an input signal of the inverter can be approximated by $$I_{Sf} = \begin{cases} 0, & t \leq \frac{V_{THP}}{V_{DD}} t_f \\ \frac{V_{DD} \cdot I_{Smax}}{(V_{DD} - V_{THP} - V_{SP}) \cdot t_f} t - \frac{V_{THP} \cdot I_{Smax}}{(V_{DD} - V_{THP} - V_{SP})}, & \frac{V_{THP}}{V_{DD}} t_f < t \leq \frac{V_{DD} - V_{SP}}{V_{DD}} t_f \\ \frac{V_{DD} \cdot I_{Smax}}{(V_{THN} - V_{SP}) \cdot t_f} t - \frac{(V_{DD} - V_{THN}) \cdot I_{Smax}}{(V_{THN} - V_{SP})}, & \frac{V_{DD} - V_{SP}}{V_{DD}} t_f < t \leq \frac{V_{DD} - V_{THN}}{V_{DD}} t_f \\ 0, & t > \frac{V_{DD} - V_{THN}}{V_{DD}} t_f \end{cases} \quad (31)$$

wherein a falling transition time of an input signal is represented by $t_f$.

Formula 30 and Formula 31 described above are approximation formulas for inverters, but may be used for logic gates other than inverters.

Charge current $I_C$ of a parasitic capacitance $C_{load}$ of an output signal line of the inverter can be expressed by $$I_C = C_{load} \frac{dv_{out}(t)}{dt} \quad (32)$$

wherein a voltage change of the output signal line is represented by $V_{out}(t)$.

A time integral value $Q_{Sr}$ of short-circuit current $I_{Sr}$ is derived from Formula 30 as follows:

$$Q_{Sr} = \int_{-\infty}^{\infty} I_{Sr} dt = \frac{I_{Smax}(V_{DD} - V_{THN} - V_{THP})}{2V_{DD}} t_r \quad (33)$$

A time integral value $Q_{Sf}$ of short-circuit current $I_{Sf}$ is derived form Formula 31 as follows:

$$Q_{Sf} = \int_{-\infty}^{\infty} I_{Sf} dt = \frac{I_{Smax}(V_{DD} - V_{THN} - V_{THP})}{2V_{DD}} t_f \quad (34)$$

Accordingly, an integral value $Q_S$ of short-circuit current flowing in a logic gate upon switching is expressed $$Q_S = \int_{-\infty}^{\infty} I_S dt = \frac{I_{Smax}(V_{DD} - V_{THN} - V_{THP})}{2V_{DD}} t_T \propto t_T \quad (35)$$

wherein $t_T$ represents a transition time of an input signal.

As seen from Formula 35, an integral value $Q_S$ of short-circuit current $I_S$ flowing into a logic gate upon switching is proportional to an input transition time $t_T$ of the logic gate. Also as seen from Formula 35, an integral value $Q_S$ is independent of whether an input signal has a rising transition or a falling transition.

An integral value $Q_C$ of charge current $I_C$ to an output load capacitance $C_{load}$ of the inverter is expressed by $$Q_C = \int_{-\infty}^{\infty} I_C dt = \int_{-\infty}^{\infty} C_{load} \frac{dv_{out}(t)}{dt} dt \quad (36)$$
$$= C_{load}[v_{out}(t)]_{-\infty}^{\infty} = C_{load}(V_{DD} - 0) = C_{load} V_{DD}$$

As seen from Formula 36, an integral value $Q_C$ does not depend on an input transition time $t_T$ of the inverter.

Accordingly, integral values $Q_{Gf}$, $Q_{Gr}$ of transient current flowing into a logic gate upon switching are expressed by $$Q_{Gf} = \int_{-\infty}^{\infty} (I_{Sf} + I_C)dt \qquad (37)$$

$$= \frac{I_{Smax}(V_{DD} - V_{THN} - V_{THP})}{2V_{DD}} t_T + C_{load}V_{DD} \propto t_T$$

$$Q_{Gr} = \int_{-\infty}^{\infty} I_{Sr}dt = \frac{I_{Smax}(V_{DD} - V_{THN} - V_{THP})}{2V_{DD}} t_T \propto t_T \qquad (38)$$

As seen from Formula 37 and Formula 38, integral values $Q_{Gf}$, $Q_{Gr}$ are proportional to an input transition time $t_T$ of a logic gate.

Figure 21:
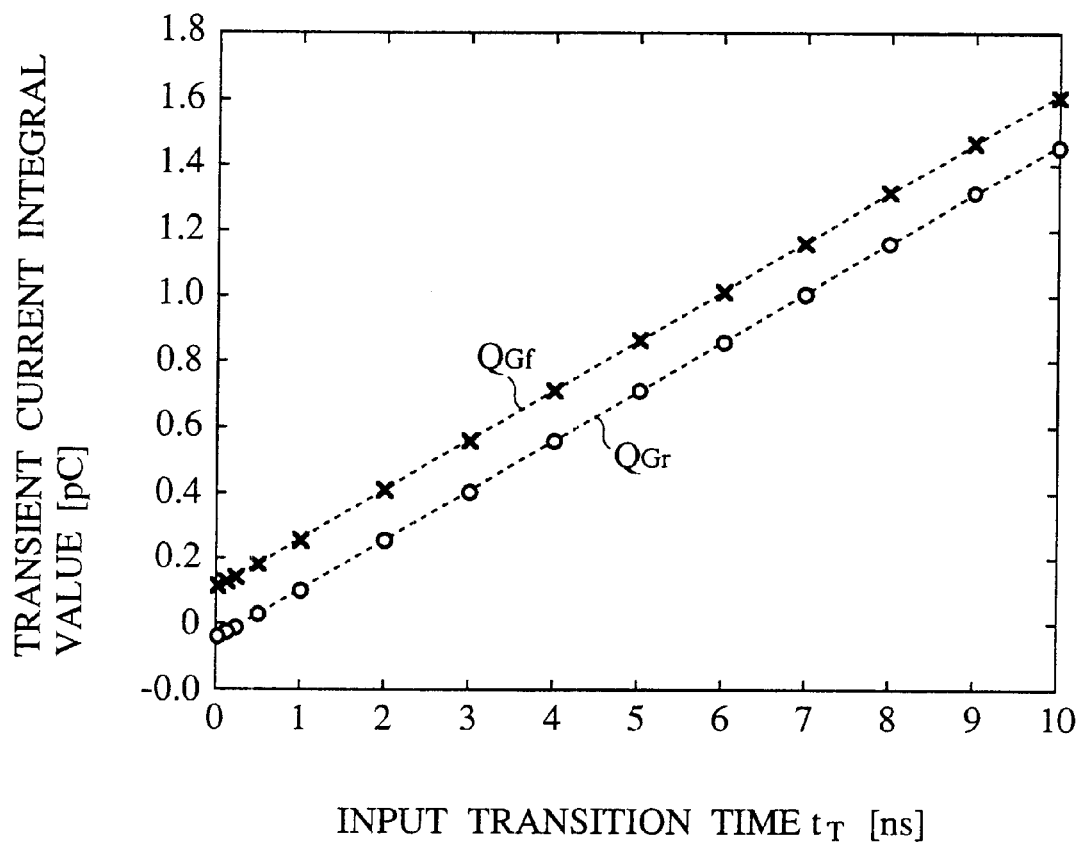
FIG. 21 is a graph of relationships between an input transition time and an integral value of transient current of a CMOS inverter.

FIG. 21 is a graph showing relationships between input transition times $t_T$ of the inverter and integral values $Q_{Gf}$, $Q_{Gr}$ of transient current. The graph of FIG. 21 was given by circuit simulation.

As seen from FIG. 21, integral values $Q_{Gf}$, $Q_{Gr}$ of transient current are proportional to input transition times $t_T$. Accordingly, correctness of Formula 37 and Formula 38 can be endorsed by the graph of FIG. 21.

Then, a basic principle of the present embodiment will be further explained by means of the semiconductor integrated circuit shown in FIG. 3A.

As described in the first embodiment, the semiconductor integrated circuit shown in FIG. 3A includes four serially arranged inverters. Currents $I_{G1}$, $I_{G2}$, $I_{G3}$, $I_{G4}$ flowing through the respective inverters $G_1$, $G_2$, $G_3$, $G_4$ are supplied by one power source. Accordingly, transient power supply current $I_{DDT}$ flowing into the integrated circuit from the power supply when the integrated circuit operates is a sum of current flowing the respective logic gates as shown in FIG. 3B.

Accordingly, transient power supply current $I_{DDT}$ is expressed by $$I_{DDT} = \sum_{n=1}^{N} I_{Gn} \qquad (39)$$

In Formula 39, N represents a number of logic gates to be switched by an inputted series of test patterns. In FIGS. 3A to 3C, N=4.

In the integrated circuit shown in FIG. 3A, an integral value $Q_{DDT}$ of transient power supply current $I_{DDT}$ is expressed as a sum of integral values $Q_{Gn}(1 \leq n \leq N)$ of integral values $Q_{Gn}$ 1 of current flowing in the respective logic gates.

Accordingly, an integral value $Q_{DDT}$ of transient power supply current $I_{DDT}$ is expressed by $$Q_{DDT} = \int_{-\infty}^{\infty} I_{DDT}dt = \int_{-\infty}^{\infty} \left(\sum_{n=1}^{N} I_{Gn}\right) dt \qquad (40)$$

$$= \sum_{n=1}^{N} \int_{-\infty}^{\infty} I_{Gn}dt = \sum_{n=1}^{N} Q_{Gn}$$

For example in the integrated circuit shown in FIG. 3A, an integral value $Q_{DDT}$ of transient power supply current $I_{DDT}$ is a sum of integral values $Q_{G1}$, $Q_{G2}$, $Q_{G3}$, $Q_{G4}$ flowing in the respective inverters.

As shown by Formula 37 and Formula 38, integral values $Q_{Gn}(1 \leq n \leq N)$ of current flowing in the respective logic gates is respectively proportional to input transition times $t_{Tn}(1 \leq n \leq N)$ of the respective logic gates.

Accordingly, an integral value $Q_{DDT}$ of transient power supply current $I_{DDT}$ is expressed by a linear polynomial $$Q_{DDT} = \sum_{n=1}^{N} Q_{Gn} = \sum_{n=1}^{N} Q_{Sn} + \sum_{n=1}^{N} Q_{Cn} = \sum_{n=1}^{N} a_n t_{Tn} + b \qquad (41)$$

In Formula 41, $a_n$ represents a proportional coefficient between an integral value $Q_{Sn}$ of short-circuit current of a logic gate $G_n$ and an input transition time $t_{Tn}(1 \leq n \leq N)$ of a logic gate $G_n$, and b represents a constant given by a sum of charge currents $Q_{Cn}$ flowing into respective logic gates.

One of main characteristics of the testing method and apparatus for integrated circuits according to the present embodiment is that path delay faults due to micro-open defects or resistive open defects in a path under test are detected by using the above-described integral values of transient power supply current.

An open defect is a divided state of a signal line which is intrinsically not divided. Open defects take place in a contact, for example when an ohmic electrode is damaged, or an oxide film is formed below an ohmic electrode. Open defects often occur in wiring due to, defective patterning or defective etching. Open defects often take place in diffused layers, polysilicon layers, etc. due to defective masks, etc.

Figure 22A:
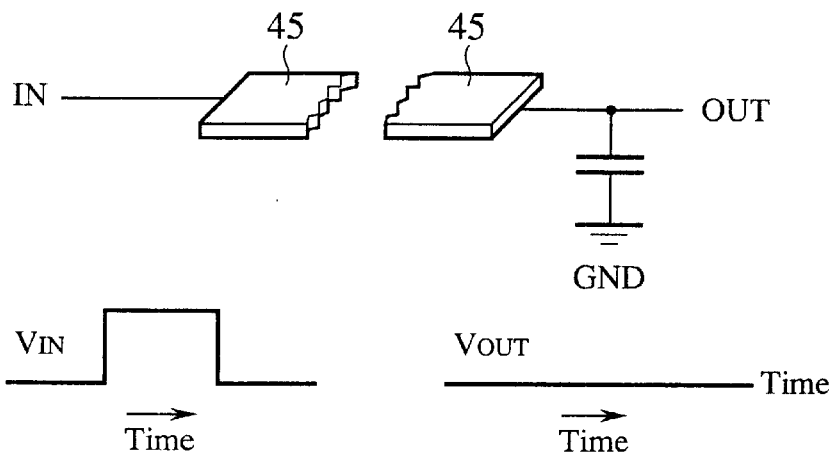
FIGS. 22A and 22B are conceptual views of an open defect.
Figure 22B:
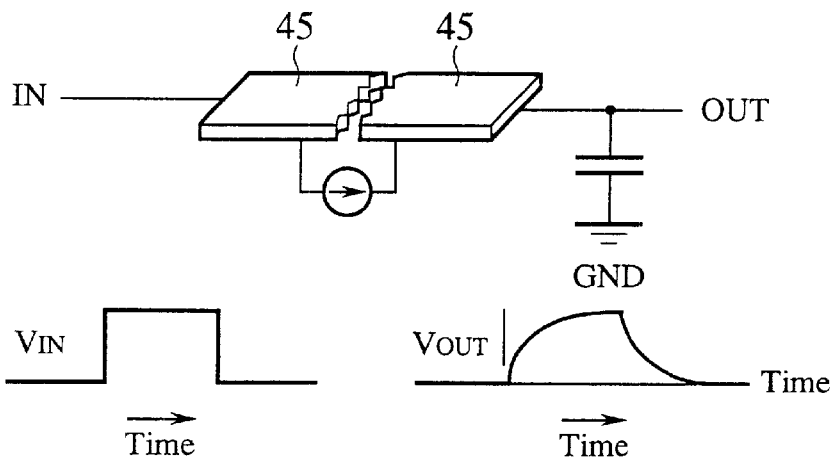

The open defects include large open defects which prohibit flow of current as shown in FIG. 22A, and open defects which admit current to flow as shown in FIG. 22B. The open defects, which admit current to flow, include micro-open defects and resistive open defects. FIGS. 22A and 22B are conceptual views of the open defects of a signal line.

In a case that a large open defect as shown in FIG. 22A is present, even when a voltage $V_{IN}$ is applied to a signal line 45 on the input side, an output voltage $V_{OUT}$ corresponding to the input voltage $V_{IN}$ is not conducted to the signal line 45 on the output side. Accordingly, a logic fault, specifically a stuck-at fault is present.

When a small open defect as shown in FIG. 22B is present, e.g., when a below 100 nm-micro-open defect is present, low leak current flows due to tunnel effect. Tunnel current flowing through micro-open defects is described in, e.g., C. L. Henderson, J. M. Soden, and C. F. Hawkins, "The Behavior and Testing Implications of IC Logic Gate Open Circuits", Proceedings of IEEE International Test Conference, pp. 302–310, 1991.

In a case that a micro-open defect is present, because current flows due to tunnel effect, transition of charges is slow, and rising and falling transition times $t_T$ of voltage in a signal line are longer. As shown in FIG. 22B, an output voltage $V_{OUT}$ is conducted to the signal line 45 on the output side much behind a timing of an input voltage $V_{IN}$ applied to the signal line 45 on the input side. Accordingly, when a micro-open defect is present in the signal line 45, a delay fault takes place.

Figure 23A:
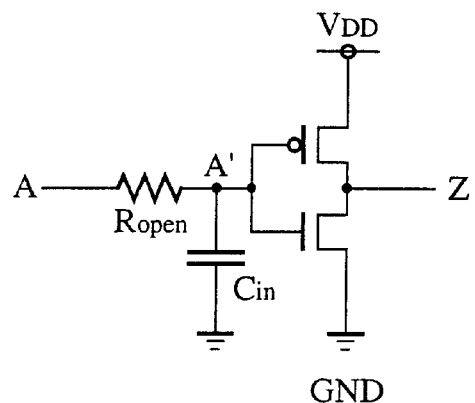
FIGS. 23A and 23B are views of an inverter having a micro-open defect or resistive open defect on the input side.
Figure 23B:
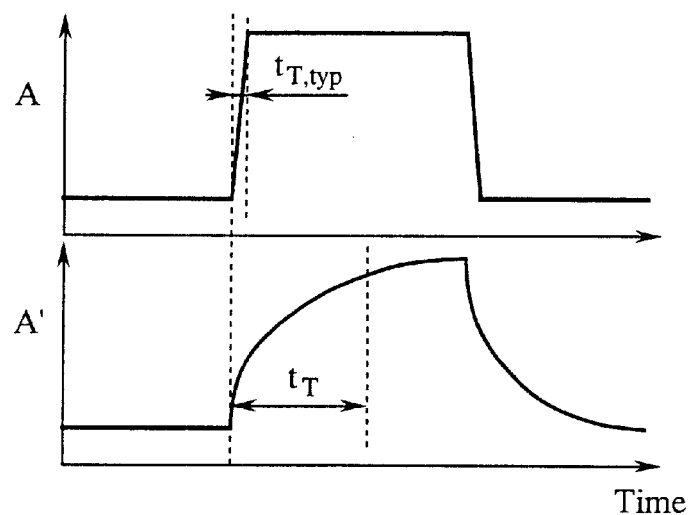

Because when such micro-open defect is present, low current flows due to tunnel effect through the defect, a signal transition can be modeled by using a high resistance $R_{open}$, and can be treated as a resistive open defect. FIG. 23A is a view of an inverter having a micro-open defect or a resistive open defect on the input side. FIG. 23B is a time chart of signal waveforms in a signal line A and a signal line A'.

As shown in FIG. 23B, a signal transition in the signal line A' is behind that in the signal line A.

When a resistance of a micro-open defect or resistive open defect is represented by $R_{open}$, and a parasitic capacitance of an input of the inverter is represented by $C_{in}$, a signal transition time $t_T$ of the signal line A' is expressed by $$t_T \approx t_{T,typ} + 2.2 R_{open} C_{in} \qquad (42)$$

wherein $t_{T,typ}$ is a typical value of the transition time of the input signal in the case of no defect. A signal transition time $t_T$ is a time of a rise of a signal voltage from 0.1 $V_{DD}$ to 0.9 $V_{DD}$ or a time of a fall of a signal voltage from 0.9 $V_{DD}$ to 0.1 $V_{DD}$.

As seen from Formula 42, an increase of a transition time of an input signal to the inverter is proportional to a resistance value $R_{open}$ of a micro-open defect or a resistive open defect.

Accordingly, when a micro-open defect or a resistive open defect is present in a path under test, an integral value $Q_{DDT}$ of power supply current of a semiconductor integrated circuit is given by $$Q_{DDT} = \sum_{n=1}^{N} a_n t_{Tn} + b = \left(\sum_{n=1}^{N} a_n t_{Tn,typ} + b\right) + 2.2 a_k C_{in} R_{open} \quad (43)$$
$$= Q_{DDT,typ} + 2.2 a_k C_{in} R_{open} \propto R_{open}$$

which is derived from Formula 41 and Formula 42.

In Formula 43, $Q_{DDT,typ}$ is a typical value of the integral value of the transient power supply current in a case that no defect is present.

As seen from Formula 43, an integral value $Q_{DDT}$ of power supply current of a semiconductor integrated circuit increases linearly in proportion to a resistance value $R_{open}$ of a micro-open defect or a resistive open defect.

Figure 24:
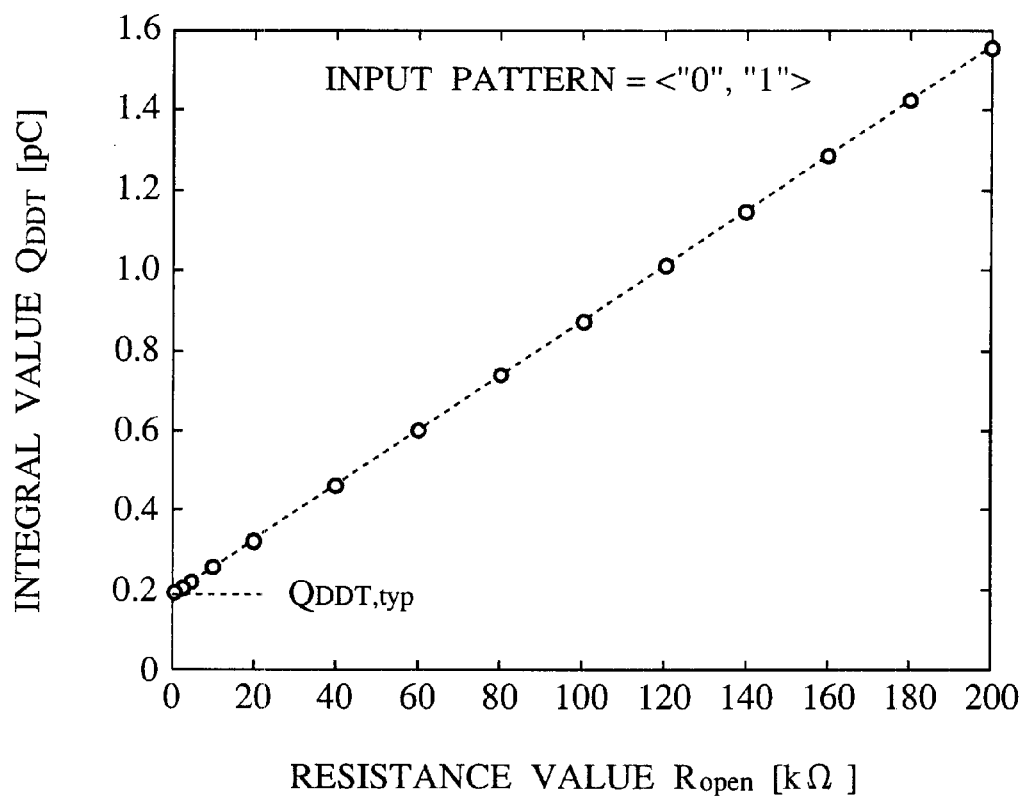
FIG. 24 is a graph of relationships between resistance values of a micro-open defect or resistive open defect, and integral values of transient power supply current.

FIG. 24 is a graph of relationships between resistance values $R_{open}$ of a micro-open defect or resistive open defect, and integral values $Q_{DDT}$ of transient power supply current. The graph of FIG. 24 was given by simulating a case that a micro-open defect or a resistive open defect is present in a signal line IN2 of a semiconductor integrated circuit shown in FIG. 3A.

The simulation result shown in FIG. 24 endorses correctness of Formula 43.

Accordingly, an integral value $Q_{DDT}$ of transient power supply current is measured, and the integral value $Q_{DDT}$ is compared with an integral value $Q_{DDT,typ}$ of a circuit having no defect, whereby it can be detected whether or not a micro-open defect or resistive open defect is present in a path under test.

Figure 25:
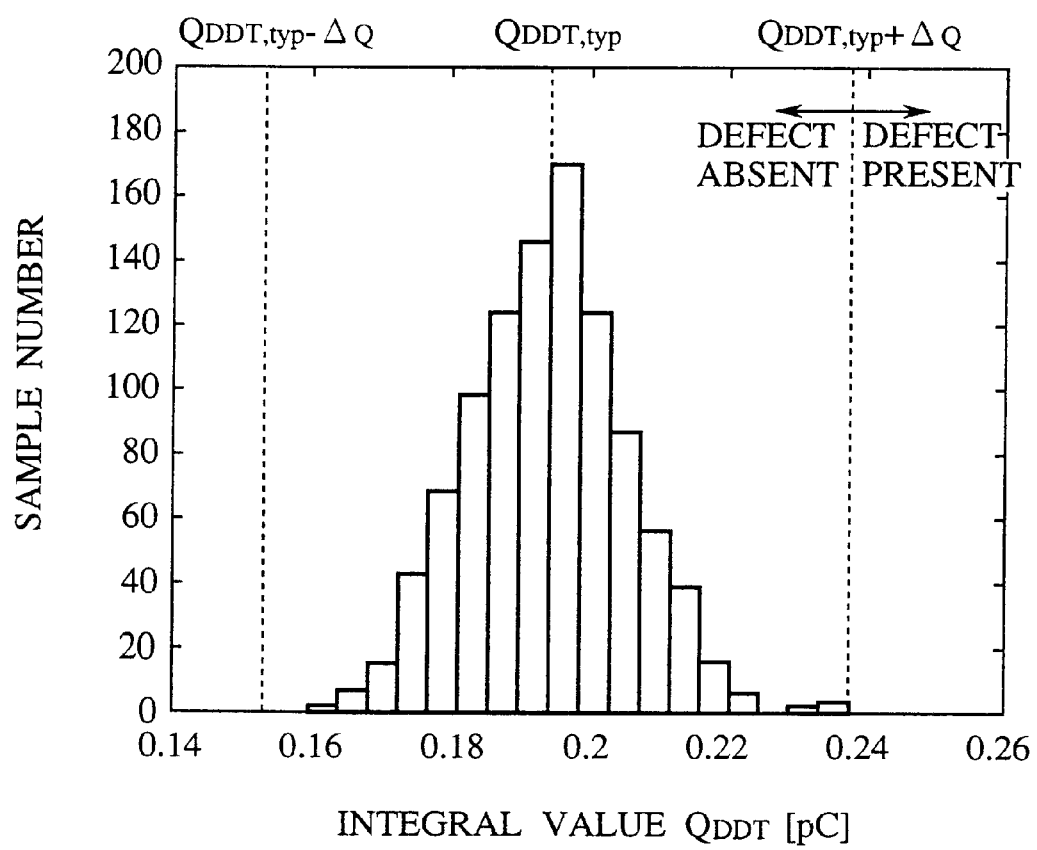
FIG. 25 is a graph of changes of an integral value of transient power supply current.

In the actual semiconductor integrated circuit fabrication process, an integral value $Q_{DDT,typ}$ of transient power supply current varies with variations of process parameters. FIG. 25 is a graph of variations of an integral values $Q_{DDT}$ of transient power supply current. In FIG. 25, integral values $Q_{DDT}$ of transient power supply current are illustrated on the horizontal axis, and numbers of samples are illustrated on the vertical axis.

As shown in FIG. 25, an integral value $Q_{DDT}$ of transient power supply current varies in a $Q_{DDT,typ} + \Delta_Q$ range. $\Delta_Q$ is a variation value of an integral value $Q_{DDT,typ}$ of transient power supply current.

Accordingly, when an integral value $Q_{DDT}$ of transient power supply current measured in the testing is above an upper limit $Q_{DDT,typ} + \Delta_Q$ of transient power supply current of a path under test, it is judged that a micro-open defect or resistive open defect is present in the path under test.

Accordingly, it can be judged that when an integral value $Q_{DDT}$ is smaller than an upper limit integral value $Q_{DDT,typ} + \Delta_Q$, neither micro-open defect nor resistive open defect is present in a path under test. When an integral value $Q_{DDT}$ of transient power supply current is larger than an upper limit integral value $Q_{DDT,typ} + \Delta_Q$, it can be judged that a micro-open defect or a resistive open defect is present in the path under test.

Thus, $$\begin{cases} \text{Defect is absent,} & Q_{DDT} \leq Q_{DDT,typ} + \Delta_Q \\ \text{Defect is present,} & Q_{DDT} > Q_{DDT,typ} + \Delta_Q \end{cases} \quad (44)$$

is given.

A typical value $Q_{DDT,typ}$ of the integral value of transient power supply current, and a variation value $\Delta_Q$ can be given by simulating process variations. It is also possible to judge a resistance intensity of a micro-open defect or resistive open defect, based on a difference between an integral value $Q_{DDT}$ of transient power supply current and a typical value $Q_{DDT,typ}$ of the integral value.

(Basic Principle of the Testing Method)

Then, a basic principle on which the testing method for semiconductor integrated circuits according to the present embodiment is based on will be explained.

The testing method for semiconductor integrated circuits according to the present embodiment evaluates a delay fault by measuring an integral value of transient power supply current of a circuit under test.

A gate delay time $t_{gd}$ of a logic gate, which is proportional to a transition time $t_T$ of an input signal, is expressed by $$t_{gd} = t_{gd,step} + \frac{1}{6}\left(1 - 2\frac{V_{TH}}{V_{DD}}\right) t_T \quad (45)$$

In Formula 45, $t_{gd,step}$ represents a delay time given when a step input of zero transition time is inputted to an inverter having neither micro-open defect nor resistive open defect. $V_{TH}$ represents a threshold voltage of a p-MOS transistor or an n-MOS transistor. The threshold voltage is $V_{TH}=V_{THN}$ for a rising transition of an input, and $V_{TH}=V_{THP}$ for a falling transition of an input.

Accordingly, when a micro-open defect or resistive open defect represented by a resistance value $R_{open}$ is present in an input signal line of a logic gate, a delay time $t_{gd}$ can be expressed by $$t_{gd} = t_{gd,step} + \frac{t_T}{6}\left(1 - 2\frac{V_{TH}}{V_{DD}}\right) \quad (46)$$
$$= t_{gd,step} + \frac{t_{T,typ} + 2.2 R_{open} C_{in}}{6}\left(1 - 2\frac{V_{TH}}{V_{DD}}\right)$$
$$= t_{gd,step} + \frac{t_{T,typ}}{6}\left(1 - 2\frac{V_{TH}}{V_{DD}}\right) + \frac{2.2 C_{in}}{6}\left(1 - 2\frac{V_{TH}}{V_{DD}}\right) R_{open}$$
$$= t_{gd,typ} + \frac{2.2 C_{in}}{6}\left(1 - 2\frac{V_{TH}}{V_{DD}}\right) R_{open} \propto R_{open}$$

In Formula 46, $t_{gd,typ}$ represents a typical value of a gate delay time of a logic gate having no defect.

As seen from Formula 46, a gate delay time $t_{gd}$ of a logic gate having a micro-open defect or resistive open defect is varied with a resistance value $R_{open}$ of the micro-open defect or resistive open defect, and an increase $\delta$ of the gate delay time $t_{gd}$ is proportional to the resistance value $R_{open}$ of the micro-open defect or resistive open defect.

A path delay time $t_{pd}$ of a path under test having a micro-open defect or resistive open defect is expressed by $$t_{pd} = \sum_{i=1}^{m} t_{gdi} = \sum_{i=1}^{m} (t_{gdi,typ} + \delta_i) \quad (47)$$

-continued $$= \sum_{i=1}^{m} t_{gdi,typ} + \frac{2.2C_{ink}}{6}\left(1 - 2\frac{V_{TH}}{V_{DD}}\right)R_{open}$$

$$= t_{pd,typ} + \frac{2.2C_{ink}}{6}\left(1 - 2\frac{V_{TH}}{V_{DD}}\right)R_{open} \propto R_{open}$$

which is derived from Formula 5.

As seen from Formula 47, a path delay time $t_{pd}$ of a path under test is proportional to a resistance value $R_{open}$.

Figure 26:
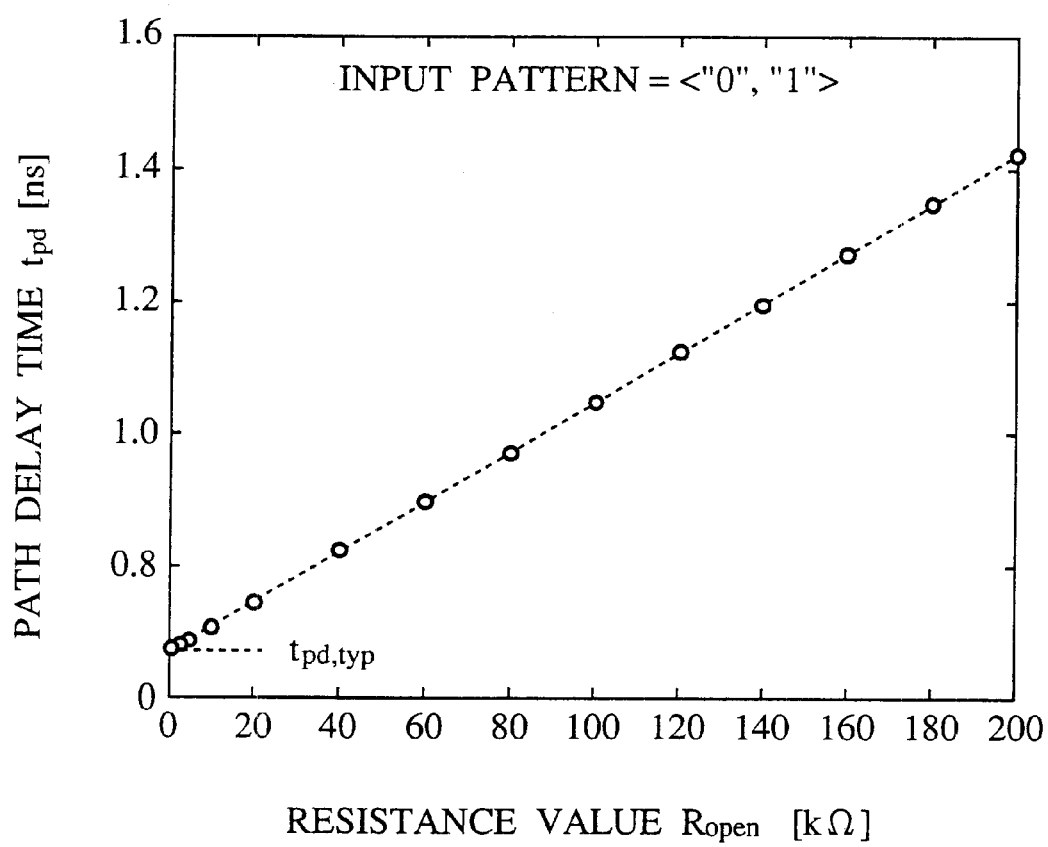
FIG. 26 is a graph of relationships between resistance values of a micro-open defect or resistive open defect, and path delay time.

FIG. 26 is a graph of relationships between resistance values $R_{open}$ of a micro-open defect or resistive open defect, and a path delay time $t_{pd}$. The graph of FIG. 26 was given by simulating a case that a micro-open defect or resistive open defect is present in the signal line IN2 of the integrated circuit of FIG. 3A.

The simulation result shown by the graph of FIG. 26 endorses correctness of Formula 47.

An integral value $Q_{DDT}$ of transient power supply current of an integrated circuit is expressed by a sum of integral values $Q_{Gi}$ of current flowing in respective logic gates $G_i(1 \leq i \leq n)$ by using Formula 40.

Accordingly, when a micro-open defect or resistive open defect is present in an input of a logic gate $G_k$ of a path P, an integral value $Q_{DDT}$ is expressed by $$Q_{DDT} = Q_{DDT,typ} + \frac{2.2I_{Smax}(V_{DD} - V_{THN} - V_{THP})C_{ink}}{2V_{DD}}R_{open} \quad (48)$$

derived from Formula 43.

As seen from Formula 48, an integral value $Q_{DDT}$ of transient power supply current is proportional to a resistance value $R_{open}$ of a micro-open defect or resistive open defect.

Accordingly, a delay time $t_{pd}$ of a path P having a micro-open defect or resistive open defect is expressed by $$t_{pd} = t_{pd,typ} + \frac{2.2C_{ink}}{6}\left(1 - 2\frac{V_{TH}}{V_{DD}}\right)R_{open} \quad (49)$$

$$= t_{pd,typ} + \frac{2.2C_{ink}}{6}\left(1 - 2\frac{V_{TH}}{V_{DD}}\right) \cdot \frac{(Q_{DDT} - Q_{DDT,typ}) \cdot 2V_{DD}}{2.2I_{Smax}(V_{DD} - V_{THN} - V_{THP})C_{ink}}$$

$$= t_{pd,typ} + \frac{V_{DD} - 2V_{TH}}{3I_{Smax}(V_{DD} - V_{THN} - V_{THP})}(Q_{DDT} - Q_{DDT,typ})$$

derived from Formula 47 and Formula 48.

As seen from Formula 49, a delay time $t_{pd}$ linearly changes with respect to integral values $Q_{DDT}$ of transient power supply current of a semiconductor integrated circuit.

Figure 27:
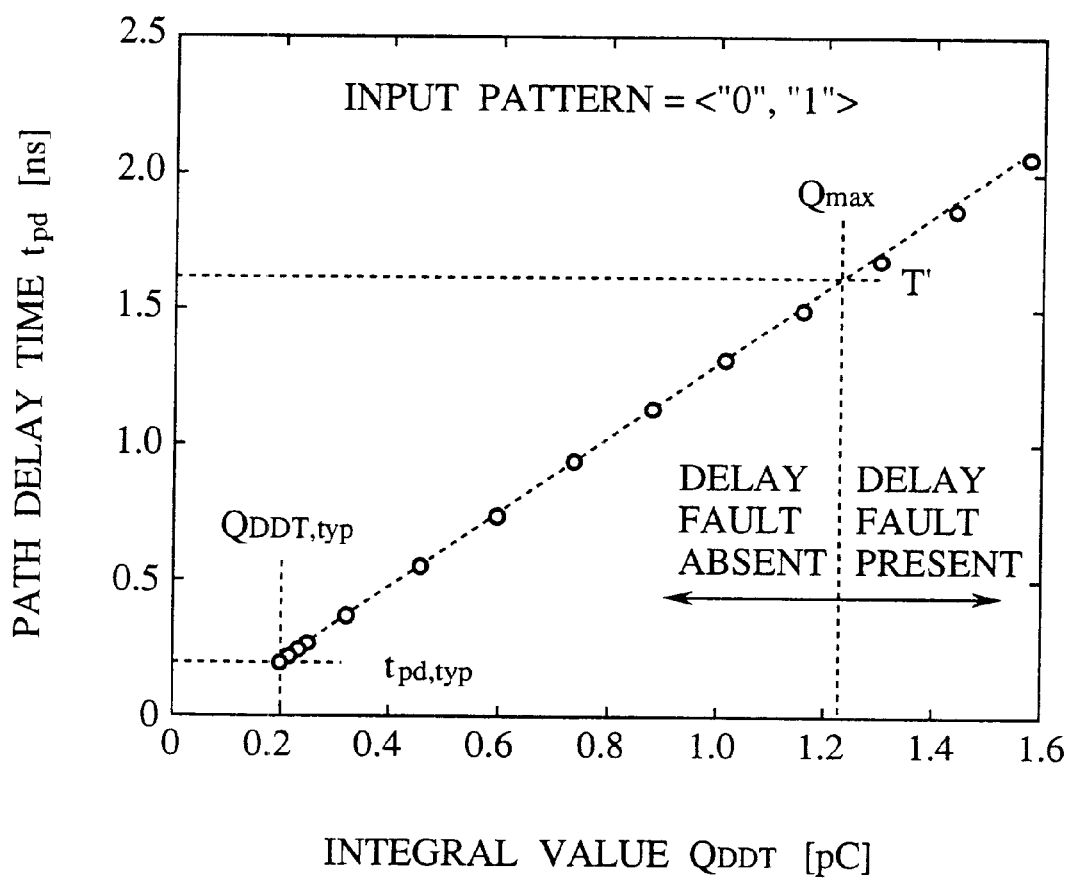
FIG. 27 is a graph of relationships between integral values of transient power supply current, and path delay time.

FIG. 27 is a graph of relationships between integral values $Q_{DDT}$ of transient power supply current and a path delay time $t_{pd}$. The graph of FIG. 27 was given by simulating a case that a micro-open defect or resistive open defect is present in the signal line IN2 of the integrated circuit of FIG. 3A.

The result of the simulation shown in FIG. 27 endorses correctness of Formula 49.

In Formula 49, when an upper limit value of an allowable path delay time $t_{pd}$ is represented by T', and an integral value of transient power supply current at this time is represented by $Q_{max}$, an integral value $Q_{max}$ is expressed by $$Q_{max} = Q_{DDT,typ} + \frac{3I_{Smax}(V_{DD} - V_{THN} - V_{THP})}{V_{DD} - 2V_{TH}}(T' - t_{pd,typ}) \quad (50)$$

$Q_{max}$ represents an upper limit value of an integral value $Q_{DDT}$ of transient power supply current, which allows the judgement of no path delay fault. That is, when an integral value $Q_{DDT}$ is smaller than an upper limit value $Q_{max}$, no path delay fault is present in a semiconductor integrated circuit. When an integral value $Q_{DDT}$ is larger than an upper limit value $Q_{max}$, a path delay fault due to a micro-open defect or resistive open defect is present in an integrated circuit.

Accordingly, $$\begin{cases} \text{Delay fault is absent,} & Q_{DDT} \leq Q_{max} \\ \text{Delay fault is present,} & Q_{DDT} > Q_{max} \end{cases} \quad (51)$$

can be given.

As described above, according to the present embodiment, an integral value $Q_{DDT}$ of transient power supply current and a predefined value $Q_{max}$ are compared with each other to thereby make the testing for detecting whether a delay fault is present in a semiconductor integrated circuit. A predefined value $Q_{max}$ can be given by Formula 50 using circuit simulation, statistic data or others.

The semiconductor integrated circuit testing method according to the present embodiment is not limited to testing for micro-open defect and delay faults but can test for stuck-at faults, etc. by suitably setting test conditions.

Testing for a stuck-at fault by the semiconductor integrated circuit testing method according to the present embodiment will be explained.

An integral value of transient power supply current of a semiconductor integrated circuit under test varies in a range of, e.g., $\pm \Delta_Q$ due to variations of process parameters of the fabrication process of the semiconductor integrated circuit. Accordingly, an integral value increases and decreases in a range of, e.g., a typical value $Q_{DDT,typ} \pm 10\%$. When an integral value is within, e.g., the range of a typical value $Q_{DDT,typ} \pm 10\%$, the circuit can be judged normal (fault-free).

However, when an integral value $Q_{DDT}$ decreases by a higher ratio than $\Delta_Q$, e.g., when an integral value $Q_{DDT}$ decreases by 20% from a typical integral value, it can be considered that some of logic gates of a path under test do not switch. In this case, it can be considered that a defect which prohibits logic gates of a path under test from switching, e.g., a large open defect is present.

Accordingly, when an integral value $Q_{DDT}$ of transient power supply current is smaller than a lower limit value $A_{DDT,typ} - \Delta_Q$ of an integral value of transient power supply current, which can be given by a circuit having no defect, it can be judged that a stuck-at fault is present in the path under test.

Accordingly, $$\begin{cases} \text{Stuck-at fault is absent,} & Q_{DDT} \geq Q_{DDT,typ} - \Delta_Q \\ \text{Stuck-at fault is present,} & Q_{DDT} < Q_{DDT,typ} - \Delta_Q \end{cases} \quad (52)$$

can be given.

In Formula 52, a typical value $Q_{DDT,typ}$ and a variation $\Delta_Q$ can be given by simulating process variations of a circuit, statistic data given by using actual devices, etc.

As described above, according to the present embodiment, an integral value of transient power supply current of a circuit under test, and a predefined value are compared with each other, whereby micro-open defects, resistive open defects, path delay faults and stuck-at faults of the path under test can be detected.

(Testing Apparatus for Semiconductor Integrated Circuits)

Figure 28:
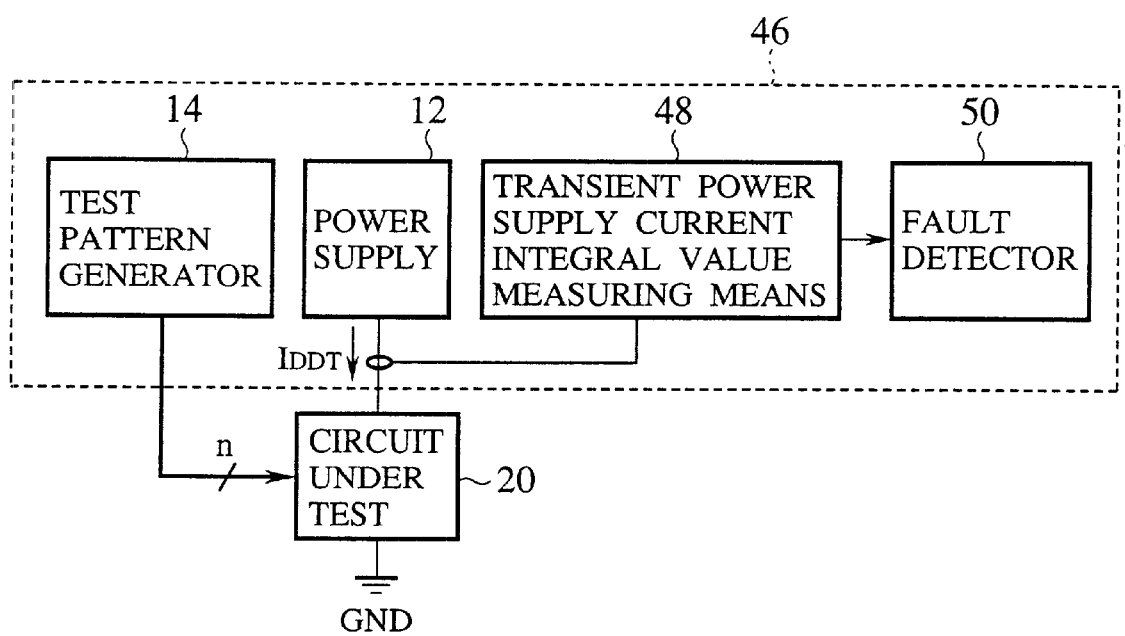
FIG. 28 is a block diagram of the testing apparatus for semiconductor integrated circuits according to a third embodiment of the present invention.

Next, the testing apparatus for semiconductor integrated circuits according to the present embodiment will be explained with reference to FIG. 28. FIG. 28 is a block diagram of the testing apparatus for semiconductor integrated circuits according to the present embodiment. The same members of the present embodiment as those of the testing apparatus for semiconductor integrated circuits, etc. according to the first or the second embodiment are represented by the same reference numbers and the explanation of which is not repeated here.

As shown in FIG. 28, the testing apparatus for semiconductor integrated circuits 46 includes a power supply 12, a test pattern generator 14, a transient power supply current integral value measuring means 48 and a fault detector 50.

The transient power supply current integral value measuring means 48 measures an integral value $Q_{DDT}$ of transient power supply current at a prescribed time interval. The transient power supply current integral value measuring means 48 will be described later.

The fault detector 50 compares an integral value of transient power supply current $Q_{DDT}$ measured by the transient power supply current integral value measuring means 48 with a predefined value to thereby judge absence and presence of a fault. The fault detector 50 may be provided by hardware or software.

Figure 29:
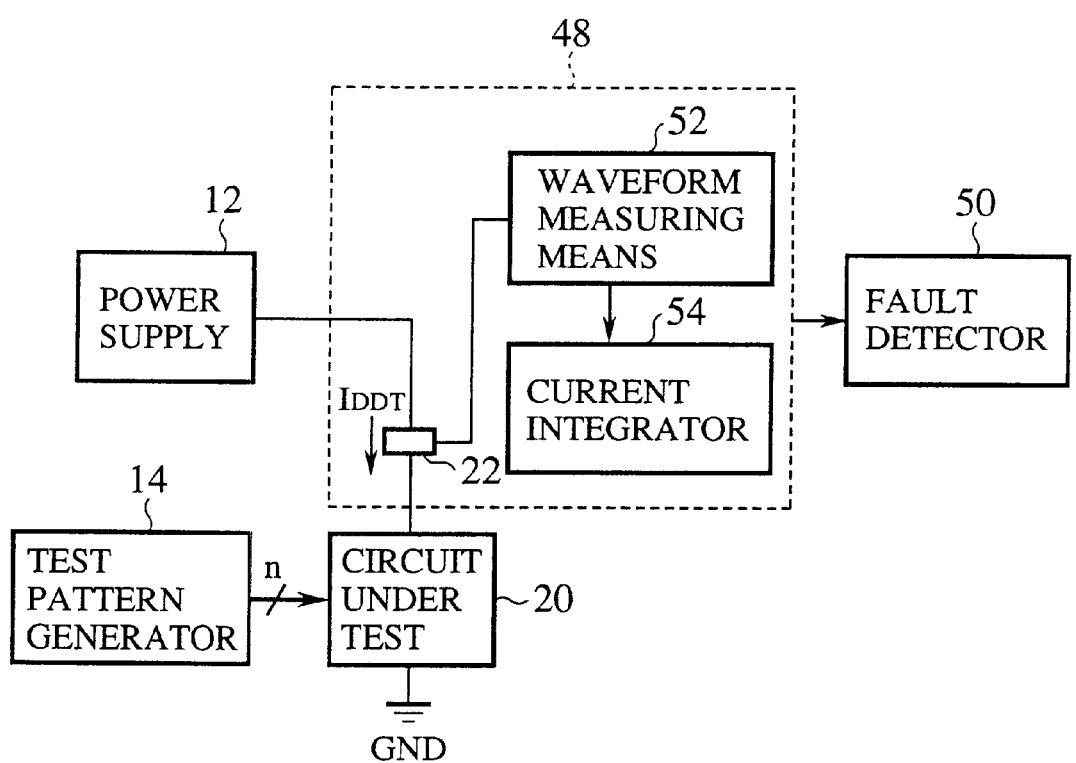
FIG. 29 is a view of another example of transient power supply current integral value measuring means.

Next, an example of the transient power supply current integral value measuring means used in the present embodiment will be explained with reference to FIG. 29. FIG. 29 is a block diagram of the example of the transient power supply current integral value measuring means used in the present embodiment.

As shown in FIG. 29, a transient power supply current integral value measuring means 48 includes a current sensor 22, a waveform measuring means 52 and a current integrator 54.

The waveform measuring means 52 measures a voltage waveform transformed by the current sensor 22. The waveform measuring means 52 can be provided by, e.g., an oscilloscope, automatic test equipment or others.

The current integrator 54 computes an integral value of current waveforms measured by the waveform measuring means 52 for a prescribed period of time. The current integrator 54 can be provided by hardware or software.

Figure 30:
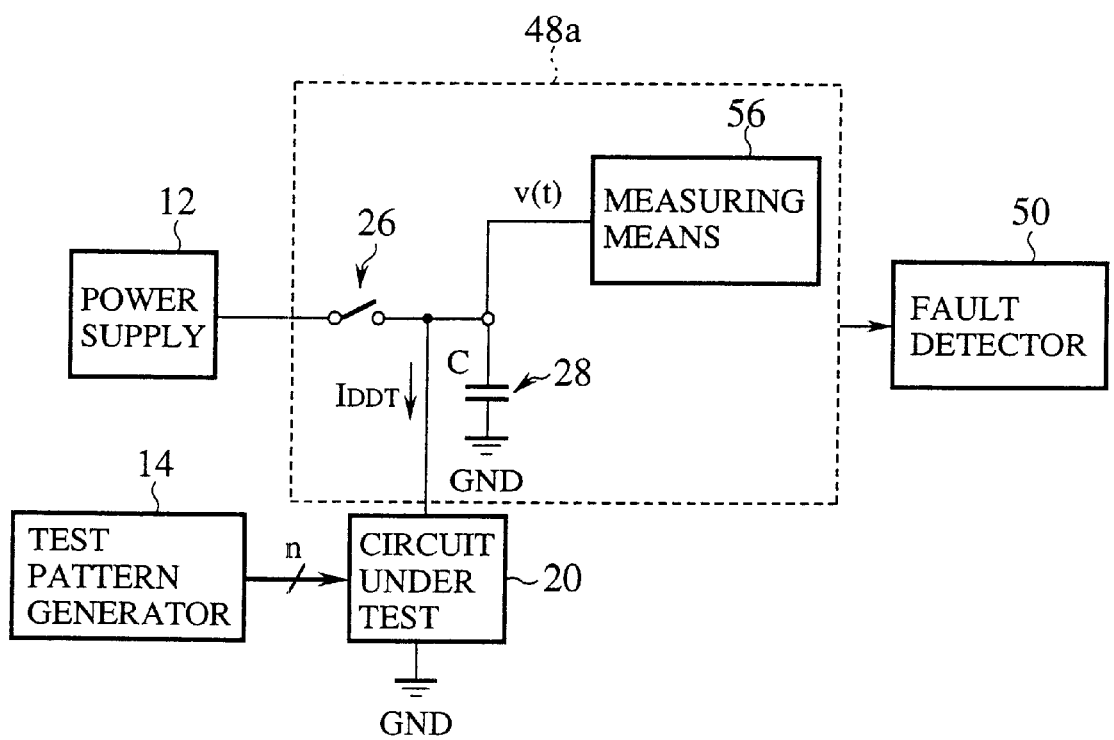
FIG. 30 is a view of another example of the transient power supply current integral value measuring means.

Next, another example of the transient power supply current integral value measuring means used in the present embodiment will be explained with reference to FIG. 30. FIG. 30 is a block diagram of the another example of the transient power supply current integral value measuring means used in the present embodiment.

The transient power supply current integral value measuring means 48a includes a switch 26, a capacitor 28 and measuring means 56.

The measuring means 56 measures an instantaneous value of a voltage waveform v(t) at the terminal of the capacitor 28 on the side of a circuit under test. The measuring means 56 can be provided by, e.g., a digital multimeter, an oscilloscope or automatic test equipment.

A transient power supply current $I_{DDT}$ flowing from the capacitor 28 into a circuit under test 20 when the circuit under test 20 has a transient state is expressed by $$I_{DDT} = -C\frac{dv(t)}{dt} \quad (53)$$

Accordingly, an integral value $Q_{DDT}$ of transient power supply current is expressed by $$\begin{aligned} Q_{DDT} &= \int_{-\infty}^{\infty} I_{DDT}\, dt \\ &= -C\int_{-\infty}^{\infty} \frac{dv(t)}{dt}\, dt = -C[v(t)]_{-\infty}^{\infty} \\ &= C[v(-\infty) - v(\infty)] \end{aligned} \quad (54)$$

where an initial value and a final value of a voltage of the capacitor 28 on the side of the measuring means 56 are represented respectively by v(−∞) and v(∞).

That is, an initial value and a final vale of a voltage of the capacitor 28 in a prescribed period of time are measured, and a difference between the two values is computed, whereby an integral value $Q_{DDT}$ of transient power supply current $I_{DDT}$ flowing in a circuit under test can be given.

An initial value of voltage of the capacitor 28 is preferably measured immediately before a signal transition takes place in the input signal line of a path under test. A final value of voltage of the capacitor 28 is preferably measured immediately after all logic gates of the path under test have switched, and power supply current has a stationary power supply current value $I_{DDQ}$.

However, because it is difficult to specify a timing when power supply current has a stationary power supply current value $I_{DDQ}$, a final value of voltage of the capacitor 28 may be measured at a timing when sufficient time has passed after a series of test patterns has been inputted.

(Testing Method for Semiconductor Integrated Circuits)

Figure 31:
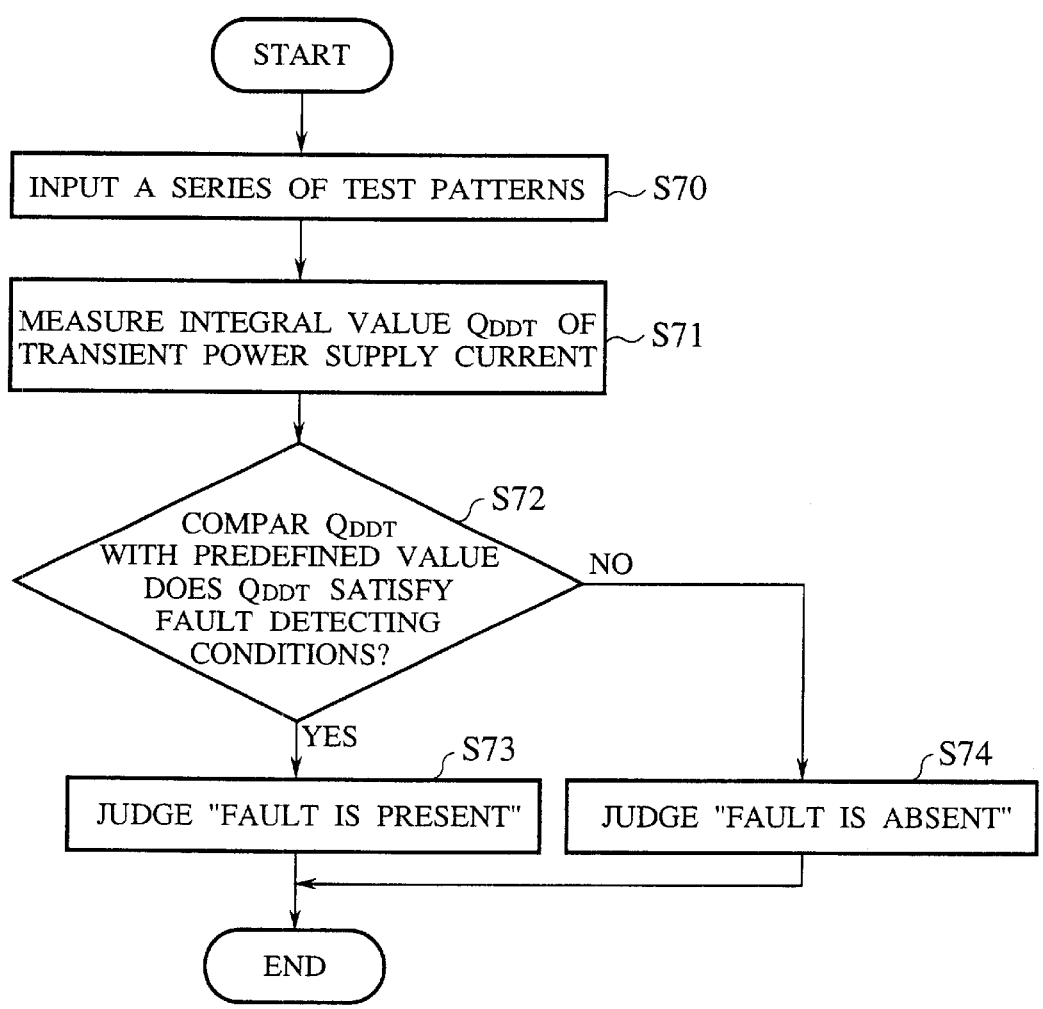
FIG. 31 is a flow chart of the testing method for semiconductor integrated circuits according to a third embodiment of the present invention.

Next, the testing method for semiconductor integrated circuits according to the present embodiment will be explained with reference to FIG. 31. FIG. 31 is a flow chart of the testing method for semiconductor integrated circuits according to the present embodiment.

First, a series of test patterns for activating a path under test is inputted by the test pattern generator 14 (Step 70).

Next, an integral value $Q_{DDT}$ of transient power supply current flowing, for a prescribed period of time T, from the power supply 12 into the power supply line of the circuit under test 20 is measured by the transient power supply current integral value measuring means 48 (Step 71). The processing of Step 71 is performed substantially simultaneously with the processing of Step 70. A prescribed period of time T is, e.g., from a timing τ(−∞) immediately before an input transition to a timing τ(∞) when the circuit under test 20 becomes sufficiently stable. An integral value of transient power supply current may be measured once or measured a plurality of times to give an average value for higher measurement accuracy.

Next, the integral value $Q_{DDT}$ of transient power supply current is compared with a predefined value by the fault detector 50 (Step 72).

When a result of the comparison between the integral value $Q_{DDT}$ of transient power supply current and the predefined value satisfies fault detection conditions, the fault detector 50 judges "Fault is Present" (Step 73).

When a result of the comparison between the integral value $Q_{DDT}$ of transient power supply current and the predefined value does not satisfy detection conditions, the fault detector judges "Fault is Absent" (Step 74).

Thus, the process is completed.

The above-described processing is repeated as shown in FIG. 12 until all contents of faults of a circuit under test, which are to be detected are covered. A fault list may contain all faults which are liable to occur, or groups of faults which can be tested at the same time.

(Micro-Open Defects or Resistive Open Defect Detection Testing Method)

Figure 32:
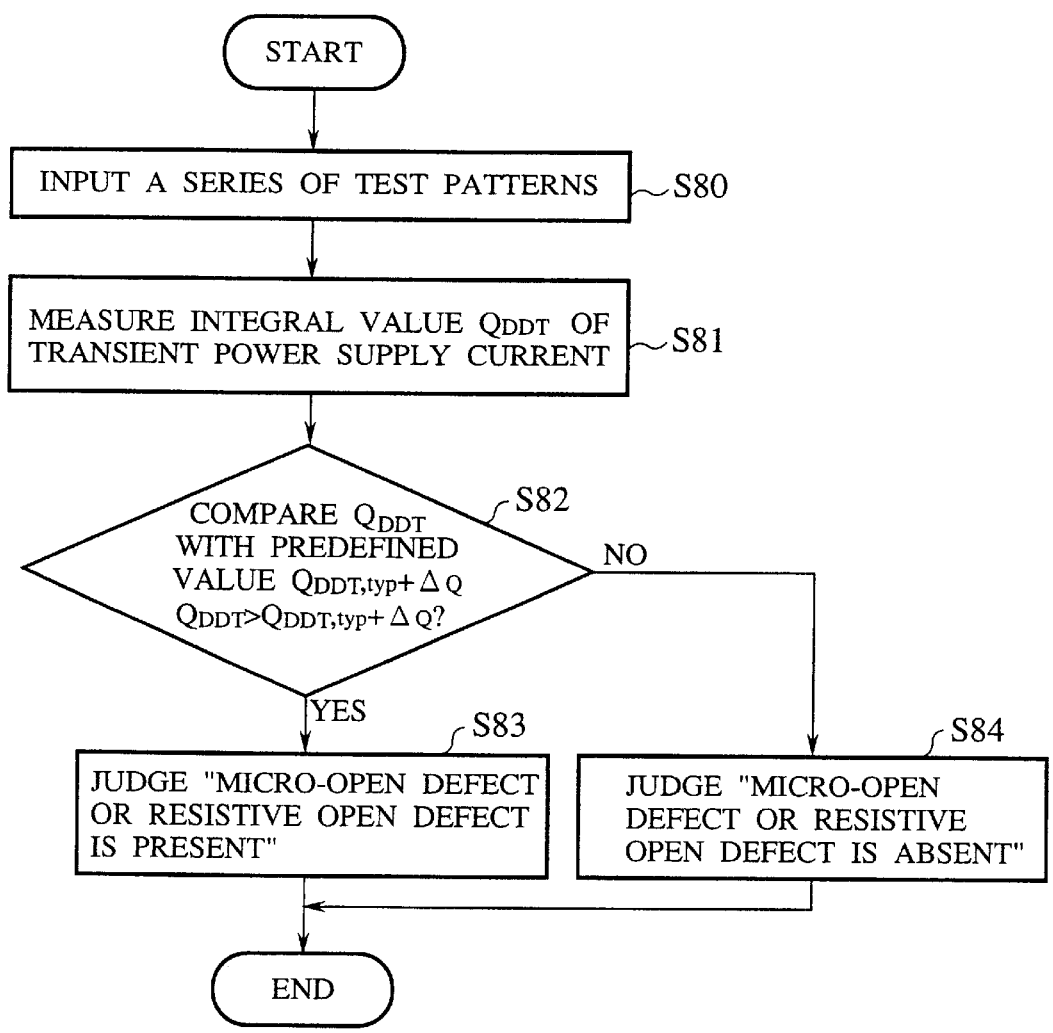
FIG. 32 is a flow chart of the micro-open defect or resistive open defect detection testing method according to the third embodiment of the present invention.

Next, the testing method for detecting micro-open defects or resistive open defects according to the present embodiment will be explained with reference to FIG. 32. FIG. 32 is a flow chart of the testing method for detecting micro-open defect or resistive open defects according to the present embodiment.

First, a series of test patterns for activating a path under test is inputted by the test pattern generator 14 (Step 80).

Next, an integral value $Q_{DDT}$ of transient power supply current, for a prescribed period of time T, from the power supply 12 into the power supply line of the circuit under test 20 is measured by the transient power supply current integral value measuring means 48 (Step 81). The processing of Step 81 is performed substantially simultaneously with the processing of Step 80. A prescribed period of time T is, e.g., from a timing $\tau(-\infty)$ immediately before an input transition to a timing $\tau(\infty)$ when the circuit under test 20 becomes sufficiently stable. An integral value of transient power supply current may be measured once or measured a plurality of times to give an average value for higher measurement accuracy.

Then, the integral value $Q_{DDT}$ of the transient power supply current is compared with a predefined value by the fault detector 50. A predefined value is, e.g., an upper limit value $Q_{DDT}+\Delta_Q$ of an integral value of transient power supply current which can be given by a circuit having no fault (Step 82).

When a result of the comparison between the integral value $Q_{DDT}$ of transient power supply current and the predefined value is $Q_{DDT}>Q_{DDT,typ}+\Delta_Q$, the fault detector 50 judges "Micro-Open Defect or Resistive Open Defect is Present" as shown in Formula 44 (Step 83).

When a result of the comparison between the integral value $Q_{DDT}$ of transient power supply current and the predefined value is $Q_{DDT} \leq _{DDT,typ}+\Delta_Q$, the fault detector 50 judges "Micro-Open Defect or Resistive Open Defect is Absent" as shown in Formula 44 (Step 84).

Thus, the processing is completed.

The above-described processing is repeated until all contents of faults of the circuit under test, which are to be detected are covered.

(Delay Fault Testing Method)

Figure 33:
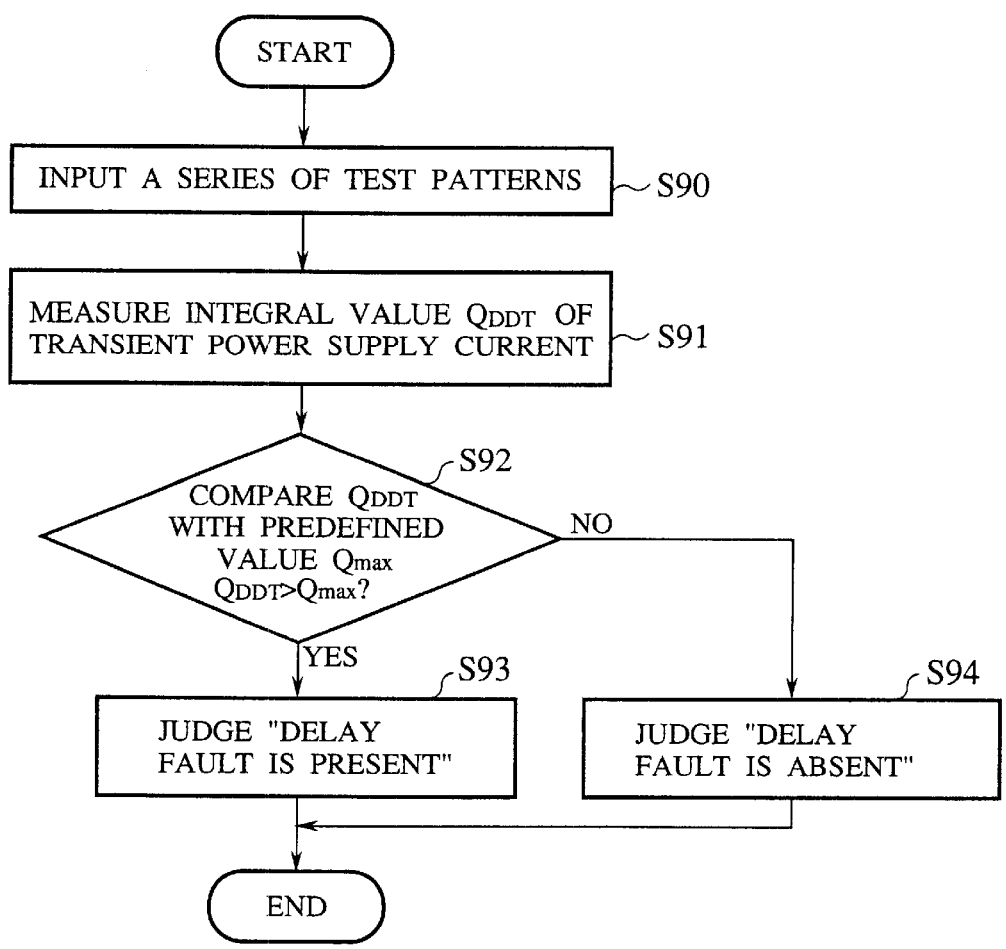
FIG. 33 is a flow chart of the delay fault testing method according to the third embodiment of the present invention.

Next, the delay fault testing method according to the present embodiment will be explained with reference to FIG. 33. FIG. 33 is a flow chart of the delay fault testing method according to the present embodiment.

First, a series of test patterns for activating a path under test is inputted by the test pattern generator 14 (Step 90).

Next, an integral value $Q_{DDT}$ of transient power supply current flowing, for a prescribed period of time T, from the power supply 12 into the power supply line of the circuit under test 20 is measured by the transient power supply current integral value measuring means 48 (Step 91). The processing of Step 91 is performed substantially simultaneously with the processing of Step 90. A prescribed period of time T is, e.g., from a timing $\tau(-\infty)$ immediately before an input transition to a timing $\tau(\infty)$ when the circuit under test 20 becomes sufficiently stable. An integral value $Q_{DDT}$ of transient power supply current may be measured once or measured a plurality of times to give an average value for higher measurement accuracy.

Next, the integral value $Q_{DDT}$ of transient power supply current is compared with a predefined value $Q_{max}$ by fault detector 104 (Step 92).

When a result of the comparison between the integral value $Q_{DDT}$ of transient power supply current and the predefined value $Q_{max}$ is $Q_{DDT}>Q_{max}$, the fault detector 104 judges "Delay Fault is Present" as shown in Formula 51 (Step 93).

When a result of the comparison between the integral value $Q_{DDT}$ of transient power supply current and the predefined value $Q_{max}$ is $Q_{DDT} \leq Q_{max}$, the fault detector 104 judges "Delay Fault is Absent" as shown in Formula 51 (Step 93).

Thus, the processing is completed. The above-described processing is repeated until all contents of fault of a circuit under test, which are to be detected are covered.

(Stuck-at Fault Testing Method)

Figure 34:
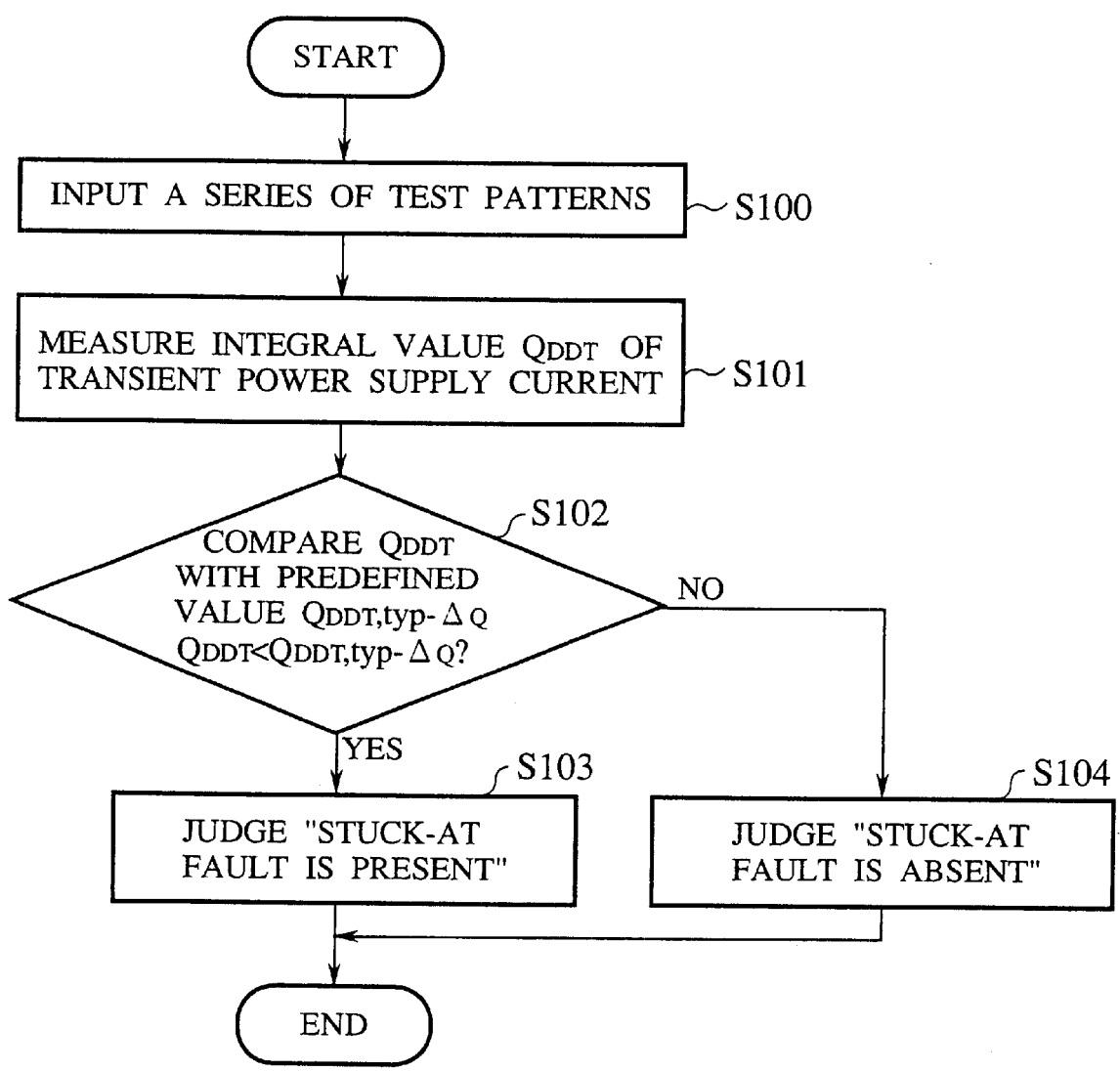
FIG. 34 is a flow chart of the stuck-at fault testing method according to the third embodiment of the present invention.

Next, the stuck-at fault testing method according to the present embodiment will be explained with reference to FIG. 34. FIG. 34 is a flow chart of the stuck-at fault testing method according to the present embodiment.

First, a series of test patterns for activating a path under test is inputted by the test pattern generator 14 (Step 100)

Next, an integral value $Q_{DDT}$ of transient power supply current flowing, for a prescribed period of time T, from the power supply 12 into the power supply line of the circuit under test 20 is measured by the transient power supply current integral value measuring means 48 (Step 101). The processing of Step 101 is performed substantially simultaneously with the processing of Step 100. An integral value of transient power supply current may be measured once or measured a plurality of times to give an average value for higher measurement accuracy. A prescribed period of time T is, e.g., from a timing $\tau(-\infty)$ immediately before an input transition to a timing $\tau(\infty)$ when the circuit under test 20 becomes sufficiently stable.

Then, the integral value $Q_{DDT}$ of transient power supply current is compared with a predefined value by the fault detector 104. A predefined value is, e.g., a lower limit value $Q_{DDT,typ}-\Delta_Q$ of an integral value of transient power supply current, which can take place in a circuit having no fault (Step 102).

When a result of the comparison between the integral value $Q_{DDT}$ of transient power supply current and the predefined value is $Q_{DDT}<Q_{DDT,typ}-\Delta_Q$ as shown in Formula 52, the fault detector 104 judges "Stuck-at Fault is Present" (Step 103).

When a result of the comparison between the integral value $Q_{DDT}$ of transient power supply current and the predefined value is $Q_{DDT} \geq Q_{DDT,typ}-\Delta_Q$, the fault detector 104 judges "Stuck-at Fault is Absent" (Step 104).

Thus, the process is completed.

The above-described processing is repeated until all contents of faults of a circuit under test, which are to be detected are covered.

As described above, according to the present embodiment, a delay fault is detected by using an integral value of transient power supply current, whereby absence and presence of a delay fault and a stuck-at fault on a path under test of a semiconductor integrated circuit can be easily detected.

Modified Embodiments

The present invention is not limited to the above-described embodiments and covers other various modifications.

For example, the above-described embodiments have been explained by means of a CMOS integrated circuit. The present invention is applicable to not only CMOS integrated circuits but also other semiconductor integrated circuits.

What is claimed is:

1. A testing apparatus for a semiconductor integrated circuit comprising:

test pattern inputting means for inputting to the semiconductor integrated circuit a test pattern sequence for activating a path under test of the semiconductor integrated circuit;

transient power supply current measuring means for measuring transient power supply current supplied to the semiconductor integrated circuit while the path under test is being activated; and fault detecting means for judging absence and presence of a fault in the path under test, based on the transient power supply current measured by the transient power supply current measuring means;

wherein the fault is a delay fault, a micro-open defect or a resistive open defect.

2. A testing apparatus for a semiconductor integrated circuit, comprising:

test pattern inputting means for inputting to the semiconductor integrated circuit a test pattern sequence for activating a path under test of the semiconductor integrated circuit;

transient power supply current measuring means for measuring transient power supply current supplied to the semiconductor integrated circuit while the path under test is being activated; and fault detecting means for judging absence and presence of a fault in the path under test, based on the transient power supply current measured by the transient power supply current measuring means;

wherein the transient power supply current measuring means measures a width of a waveform of the transient power supply current; and wherein the fault detecting means judges presence of a delay fault in the path under test when the width of the waveform of the transient power supply current is larger than a standard width of a waveform of transient power supply current, which is an expected value of the path under test, by a prescribed value.

3. A testing apparatus for a semiconductor integrated circuit according to claim 2, wherein the transient power supply current measuring means includes a capacitor for supplying power supply current to the semiconductor integrated circuit, and measures a time differential value of a voltage applied to the semiconductor integrated circuit by the capacitor to obtain a waveform of the transient power supply current.

4. A testing apparatus for a semiconductor integrated circuit, comprising:

test pattern inputting means for inputting to the semiconductor integrated circuit a test pattern sequence for activating a path under test of the semiconductor integrated circuit;

transient power supply current measuring means for measuring transient power supply current supplied to the semiconductor integrated circuit while the path under test is being activated; and fault detecting means for judging absence and presence of a fault in the path under test, based on the transient power supply current measured by the transient power supply current measuring means;

wherein the transient power supply current measuring means measures a width of a waveform of the transient power supply current; and wherein the fault detecting means judges that a stuck-at fault is present in the path under test when the width of the waveform of the transient power supply current is smaller than a standard width of a waveform of transient power supply current, which is an expected value of the path under test, by a prescribed value.

5. A testing apparatus for a semiconductor integrated circuit according to claim 4, wherein the transient power supply current measuring means includes a capacitor for supplying power supply current to the semiconductor integrated circuit, and measures a time differential value of a voltage applied to the semiconductor integrated circuit by the capacitor to obtain a waveform of the transient power supply current.

6. A testing apparatus for semiconductor integrated circuit, comprising:

test pattern inputting means for inputting to the semiconductor integrated circuit a test pattern sequence for activating a path under test of the semiconductor integrated circuit;

transient power supply current measuring means for measuring transient power supply current supplied to the semiconductor integrated circuit while the path under test is being activated; and fault detecting means for judging absence and presence of a fault in the path under test, based on the transient power supply current measured by the transient power supply current measuring means;

wherein the transient power supply current measuring means measures an instantaneous value of the transient power supply current at a timing which is later than a standard delay time, which is an expected delay time of the path under test, by a prescribed time; and wherein the fault detecting means judges that a delay fault is present in the path under test when an instantaneous value of the transient power supply current at said timing is larger than a threshold value which allows a judgement that transient power supply current is being supplied to the semiconductor integrated circuit.

7. A testing apparatus for a semiconductor integrated circuit according to claim 6, wherein the transient power supply current measuring means includes a capacitor for supplying power supply current to the semiconductor integrated circuit, and measures a time differential value of a voltage applied to the semiconductor integrated circuit by the capacitor to obtain an instantaneous value of the transient power supply current.

8. A testing apparatus for a semiconductor integrated circuit, comprising:

test pattern inputting means for inputting to the semiconductor integrated circuit a test pattern sequence for activating a path under test of the semiconductor integrated circuit;

transient power supply current measuring means for measuring transient power supply current supplied to the semiconductor integrated circuit while the path under test is being activated; and fault detecting means for judging absence and presence of a fault in the path under test, based on the transient power supply current measured by the transient power supply current measuring means;

wherein the transient power supply current measuring means measures an instantaneous value of the transient power supply current at a timing which is earlier than a normal delay time, which is an expected delay time of the path under test, by a prescribed time;

wherein the fault detecting means judges that a stuck-at fault is present in the path under test when a value of the transient power supply current at said timing is smaller than a threshold value which allows a judgement that transient power supply current is being supplied to the semiconductor integrated circuit; and wherein the transient power supply current measuring means includes a capacitor for supplying power supply current to the semiconductor integrated circuit, and measures a time differential value of a voltage applied to the semiconductor integrated circuit by the capacitor to obtain an instantaneous value of the transient power supply current.

9. A testing apparatus for a semiconductor integrated circuit, comprising:

test pattern inputting means for inputting to the semiconductor integrated circuit a test pattern sequence for activating a path under test of the semiconductor integrated circuit;

transient power supply current measuring means for measuring transient power supply current supplied to the semiconductor integrated circuit while the path under test is being activated; and fault detecting means for judging absence and presence of a fault in the path under test, based on the transient power supply current measured by the transient power supply current measuring means;

wherein the transient power supply current measuring means measures an integral value of the transient power supply current; and wherein the fault detecting means judges that a delay fault is present in the path under test when the integral value of the transient power supply current is larger than an integral value corresponding to a standard delay time, which is an expected delay time of the path under test, by a prescribed value.

10. A testing apparatus for a semiconductor integrated circuit, comprising:

test pattern inputting means for inputting to the semiconductor integrated circuit a test pattern sequence for activating a path under test of the semiconductor integrated circuit;

transient power supply current measuring means for measuring transient power supply current supplied to the semiconductor integrated circuit while the path under test is being activated; and fault detecting means for judging absence and presence of a fault in the path under test, based on the transient power supply current measured by the transient power supply current measuring means;

wherein the transient power supply current measuring means measures an integral value of the transient power supply current; and wherein the fault detecting means judges that a micro-open defect or resistive open defect is present in the path under test when the integral value of the transient power supply current is larger than an integral value corresponding to a standard delay time, which an is expected delay time of the path under test, by a prescribed value.

11. A testing method for a semiconductor integrated circuit comprising:

inputting a test pattern sequence for activating a path under test of a semiconductor integrated circuit, and judging absence and presence of a fault in the path under test, based on transient power supply current supplied to the semiconductor integrated circuit while the path under test is being activated;

wherein the fault is a delay fault, a micro-open defect or a resistive open defect.

12. A testing method for a semiconductor integrated circuit, comprising:

inputting a test pattern sequence for activating a path under test of a semiconductor integrated circuit, and judging absence and presence of a fault in the path under test, based on transient power supply current supplied to the semiconductor integrated circuit while the path under test is being activated;

wherein absence and presence of a delay fault or a stuck-at fault in the path under test is judged by comparing a width of a waveform of the transient power supply current with a standard width of a waveform of transient power supply current, which is an expected value of the path under test.

13. A testing method for a semiconductor integrated circuit, comprising:

inputting a test pattern sequence for activating a path under test of a semiconductor integrated circuit, and judging absence and presence of a fault in the path under test, based on transient power supply current supplied to the semiconductor integrated circuit while the path under test is being activated;

wherein absence and presence of a delay fault or a stuck-at fault in the path under test is judged by comparing an instantaneous value of the transient power supply current at a timing which is later or earlier by a prescribed time than a standard delay time which is an expected delay time of the path under test, with a threshold value which allows judgement that transient power supply current is being supplied to the semiconductor integrated circuit.

14. A testing method for a semiconductor integrated circuit, comprising:

inputting a test pattern sequence for activating a path under test of a semiconductor integrated circuit, and judging absence and presence of a fault in the path under test, based on transient power supply current supplied to the semiconductor integrated circuit while the path under test is being activated;

wherein absence or presence of a delay fault, a stuck-at fault, a micro-open defect or a resistive open defect in the path under test is judged by comparing an integral value of the transient power supply current with an integral value corresponding to a standard delay time which is an expected delay time of the path under test.

15. A delay time measuring apparatus comprising:

test pattern inputting means for inputting a test pattern sequence for activating a path under test of a semiconductor integrated circuit to the semiconductor integrated circuit;

transient power supply current waveform measuring means for measuring a width of a waveform of transient power supply current supplied to the semiconductor integrated circuit while the path under test is being activated; and delay time measuring means for measuring a delay time of the path under test, based on the width of the waveform of the transient power supply current measured by the transient power supply current waveform measuring means.

16. A method for measuring a delay time comprising:

inputting a test pattern sequence for activating a path under test of a semiconductor integrated circuit to the semiconductor integrated circuit; and measuring a delay time of the path under test, based on a width of a waveform of transient power supply current supplied to the semiconductor integrated circuit while the path under test is being activated.

* * * * *